US012751292B2

(12) United States Patent
Lin et al.

(10) Patent No.: US 12,751,292 B2
(45) Date of Patent: Sep. 29, 2026

(54) PACKAGE STRUCTURE INCLUDING RING STRUCTURE ATTACHED BY HYBRID ADHESIVE AND METHODS OF FORMING THE SAME

(71) Applicant: Taiwan Semiconductor Manufacturing Company Limited, Hsinchu (TW)

(72) Inventors: Wen-Yi Lin, New Taipei City (TW); Yi-Che Chiang, Hsinchu (TW); Chien-Chen Li, Hsinchu (TW); Chien-Li Kuo, Hsinchu City (TW); Kuo-Chio Liu, Hsinchu City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 545 days.

(21) Appl. No.: 18/191,085

(22) Filed: Mar. 28, 2023

(65) Prior Publication Data

US 2024/0332212 A1 Oct. 3, 2024

(51) Int. Cl.

| | |
|---|---|
| ***H10W 42/00*** | (2026.01) |
| ***H10B 80/00*** | (2026.01) |
| ***H10W 74/15*** | (2026.01) |
| ***H10W 90/00*** | (2026.01) |

(52) U.S. Cl.

CPC .......... *H10W 42/121* (2026.01); *H10B 80/00* (2023.02); *H10W 90/00* (2026.01); *H10W 74/15* (2026.01); *H10W 90/724* (2026.01); *H10W 90/734* (2026.01)

(58) Field of Classification Search

CPC ....... H01L 23/562; H01L 25/50; H01L 24/16; H01L 24/32; H01L 24/73; H01L 2224/16227; H01L 2224/32225; H01L 2224/73204; H10B 80/00; H10W 42/121; H10W 90/00; H10W 74/15; H10W 90/724; H10W 90/734

See application file for complete search history.

(56) References Cited

U.S. PATENT DOCUMENTS

| | | | | |
|---|---|---|---|---|
| 2018/0261554 | A1* | 9/2018 | Huang | H10W 42/121 |
| 2020/0075527 | A1* | 3/2020 | Huang | H10W 70/635 |
| 2023/0018359 | A1* | 1/2023 | Tsai | H10W 40/22 |

* cited by examiner

*Primary Examiner* — Benjamin Tzu-Hung Liu
(74) *Attorney, Agent, or Firm* — The Marbury Law Group, PLLC

(57) ABSTRACT

A package structure includes a package substrate, a semiconductor die module on the package substrate, a ring structure on the package substrate adjacent to the semiconductor die module, and a hybrid adhesive having a first modulus and a second modulus less than the first modulus and attaching the ring structure to the package substrate.

20 Claims, 18 Drawing Sheets

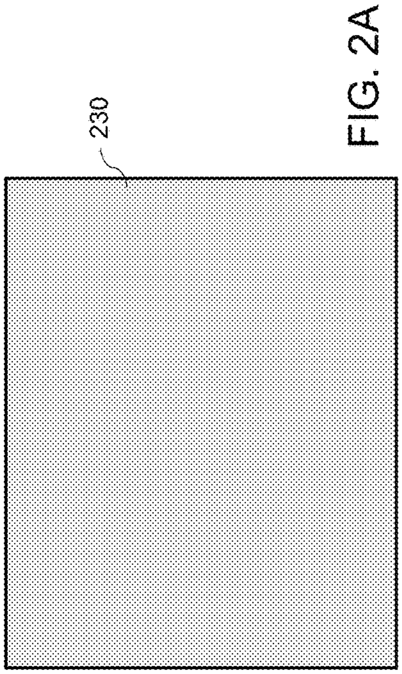
FIG. 2A
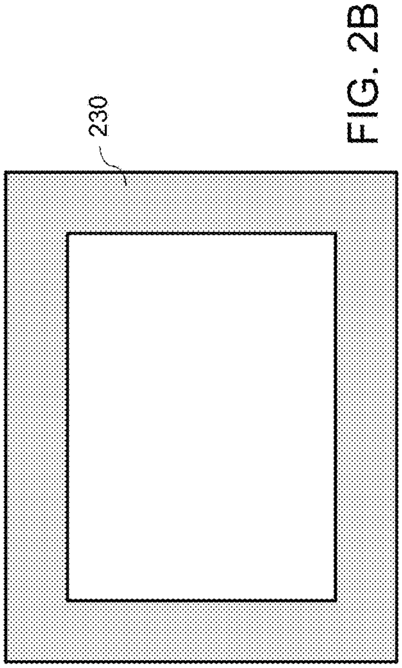
FIG. 2B
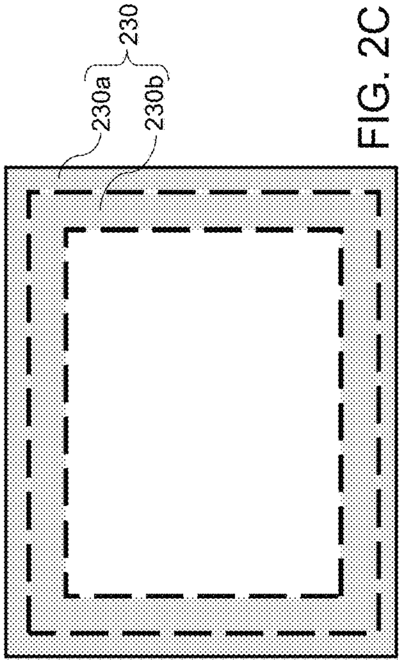
FIG. 2C
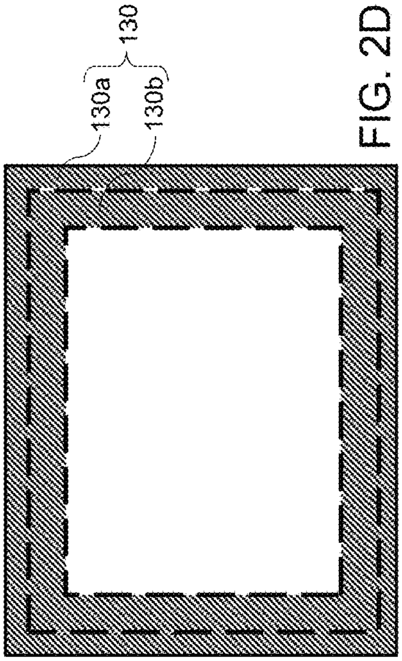
FIG. 2D
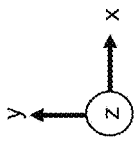

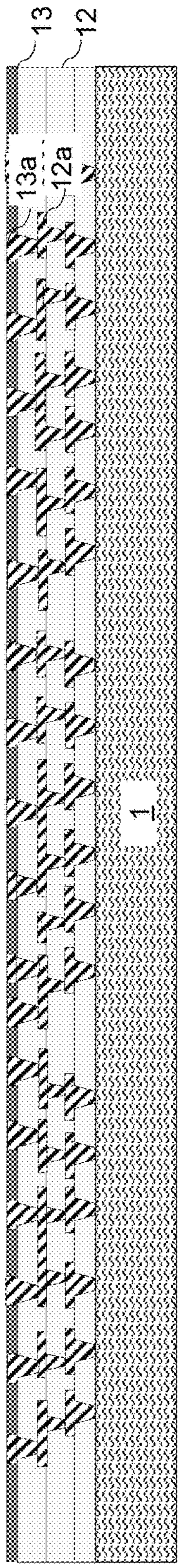
FIG. 3A
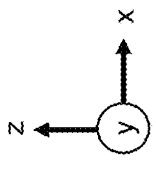

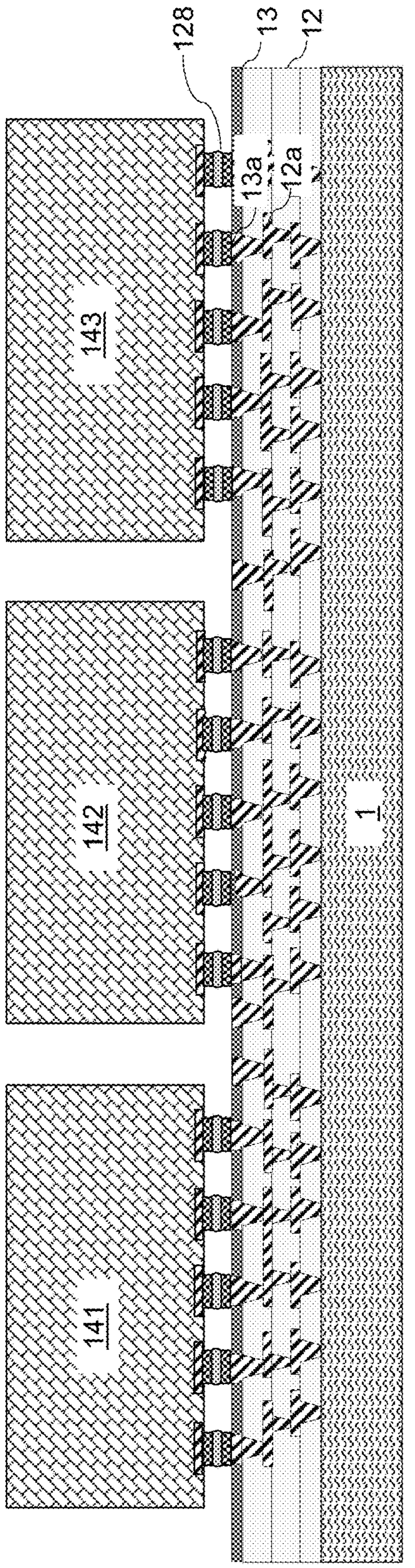
FIG. 3B
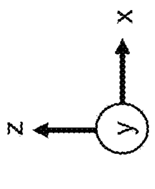

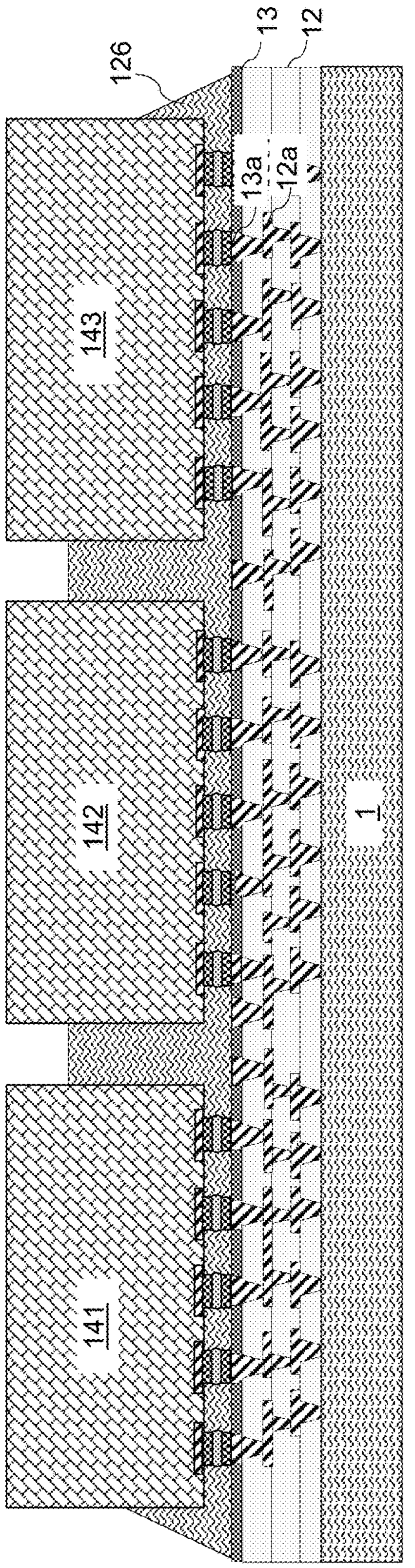
FIG. 3C
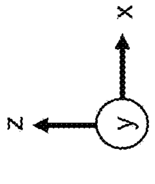

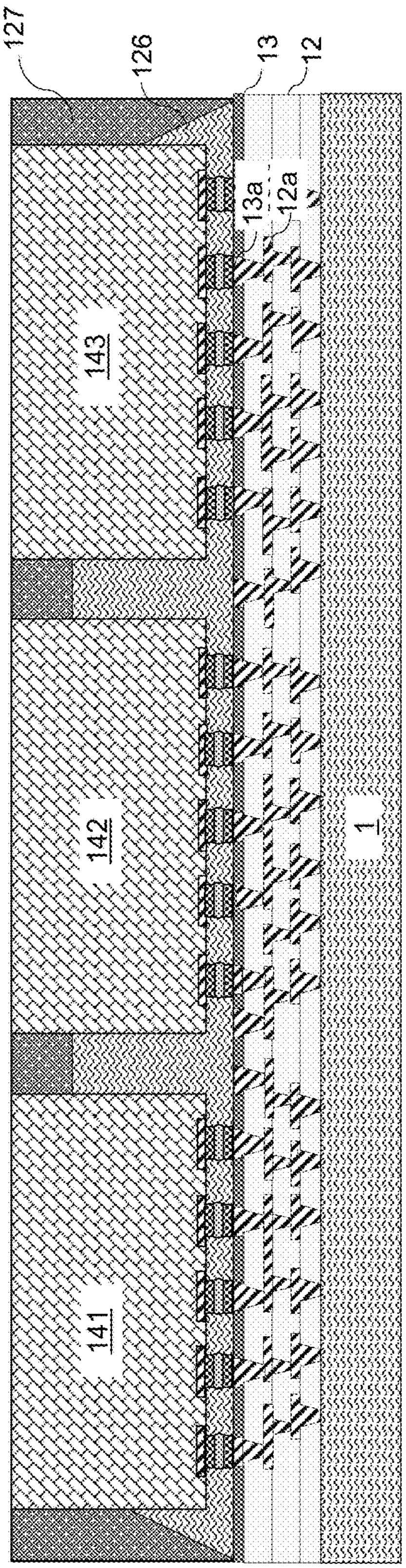
FIG. 3D
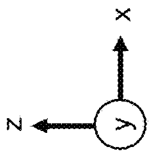

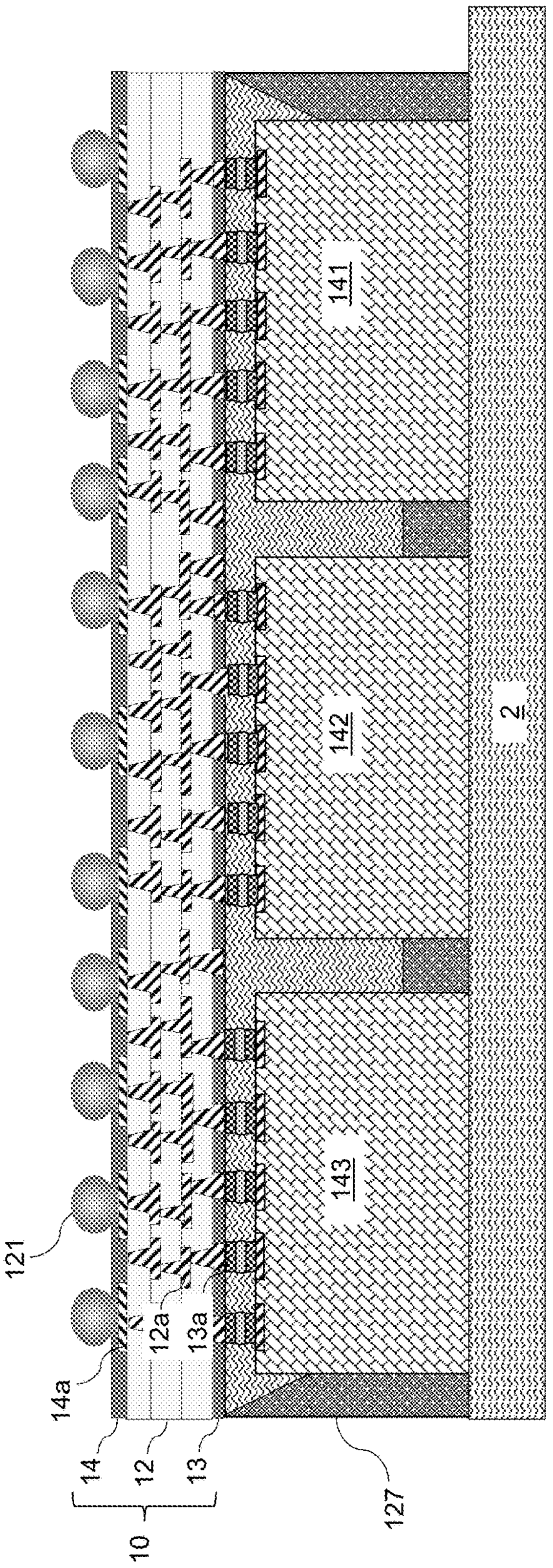
FIG. 3E
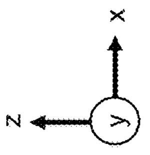

PACKAGE STRUCTURE INCLUDING RING STRUCTURE ATTACHED BY HYBRID ADHESIVE AND METHODS OF FORMING THE SAME

BACKGROUND

A package structure may include one or more semiconductor dies (e.g., semiconductor die modules, interposer modules, etc.) attached to a package substrate. A ring structure (e.g., stiffener ring) may also be attached to the package substrate around the semiconductor dies. The ring structure may help mitigate against warpage of the package substrate. The ring structure may be attached to the package substrate by an adhesive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a plan view (e.g., top-down view) of an intermediate structure including a metal sheet, according to one or more embodiments.

FIG. 2B is a plan view (e.g., top-down view) of an intermediate structure including the metal sheet having a frame shape, according to one or more embodiments.

FIG. 2C is a plan view (e.g., top-down view) of an intermediate structure including the metal sheet including an outer metal sheet portion and an inner metal sheet portion, according to one or more embodiments.

FIG. 2D is a plan view (e.g., top-down view) of an intermediate structure including the ring structure having the outer ring structure portion and the inner ring structure portion, according to one or more embodiments.

FIG. 3A is a vertical cross-sectional view of an intermediate structure including a portion of the interposer (e.g., organic interposer) formed on a first carrier substrate (e.g., carrier wafer) according to an embodiment of the present invention.

FIG. 3B is a vertical cross-sectional view of an intermediate structure including the first semiconductor die, second semiconductor die and third semiconductor die, according to one or more embodiments.

FIG. 3C is a vertical cross-sectional view of an intermediate structure including the interposer underfill layer according to one or more embodiments.

FIG. 3D is a vertical cross-sectional view of an intermediate structure including the molding material layer, according to one or more embodiments.

FIG. 3E illustrates a vertical cross-sectional view of an intermediate structure including the plurality of C4 bumps, according to one or more embodiments.

DETAILED DESCRIPTION

Figure 1A:
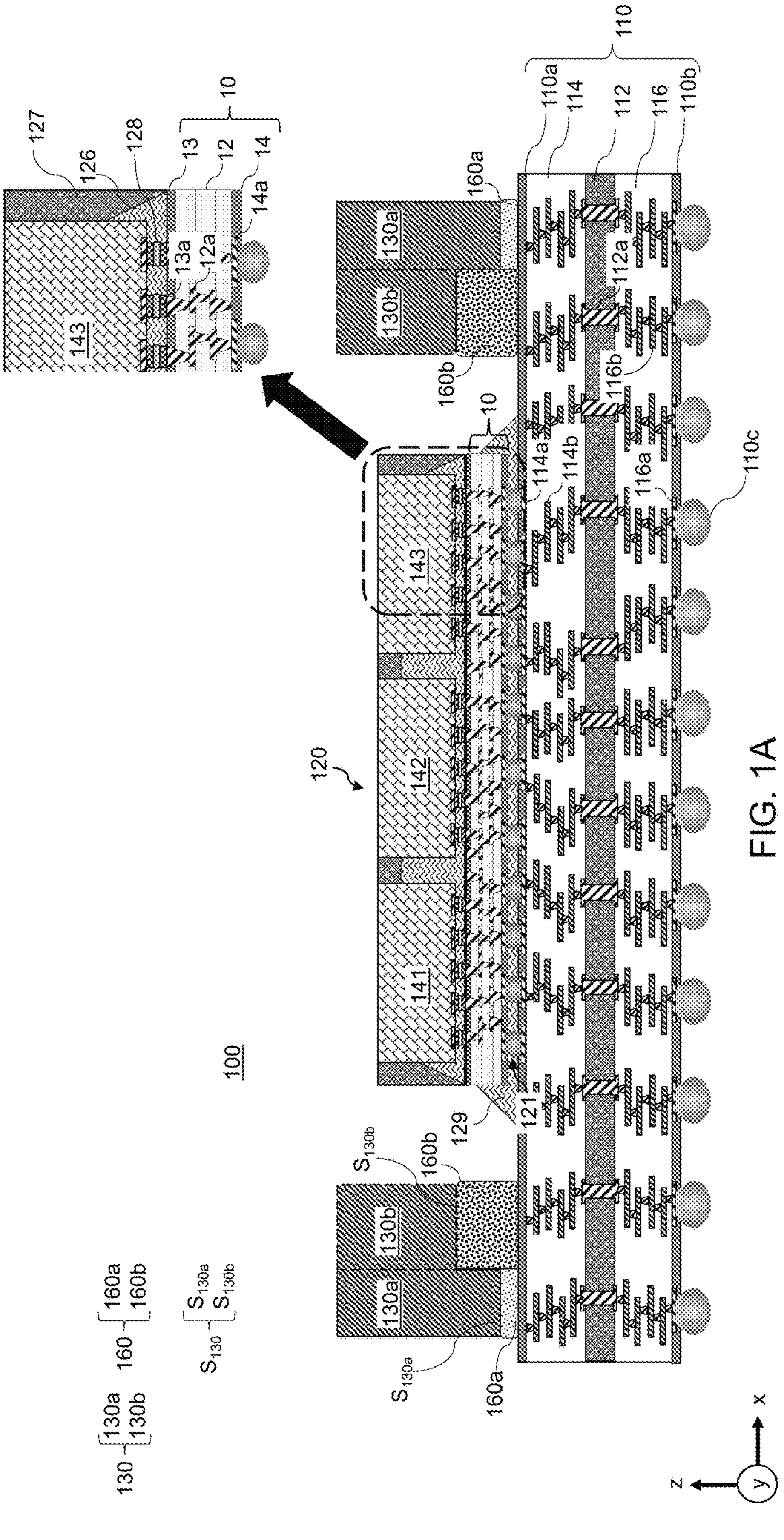
FIG. 1A is a vertical cross-sectional view of a package structure 100 (e.g., organic/silicon interposer package) according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A package structure (e.g., package assembly, integrated circuit (IC) package, semiconductor package, etc.) may include a ring structure made of a metal material (e.g., single metal) such as copper, an alloy such as iron-nickel alloy (e.g., alloy 42), stainless steel (e.g., SUS430), etc. The ring structure may be intended to mitigate against warpage such as warpage resulting from a board-level solder jointing process. However, a coefficient of thermal expansion (CTE) of a copper ring structure (e.g., about 17 ppm/° C.), may be greater than the CTE of an organic substrate (e.g., about 14.5 ppm/° C.). Thus, there is a risk of CTE mismatch between the ring structure and the package substrate. The CTE mismatch may cause a significant level of package warpage. The CTE mismatch may also cause a crack in a corner of a package underfill (e.g., an underfill corner crack) to occur under a torture test (e.g., cyclical loading). The underfill corner cracks and bump cracks may occur due to a shear stress and a peeling stress generated by the CTE mismatch between the ring structure and the package substrate.

In addition, a size of the package structure may increase over time to have an area greater than 110 mm×110 mm. As the size of the package structure increases, mitigating against package warpage and reducing a risk of underfill corner cracks and solder bump cracks may become even more challenging. Thus, semiconductor fabricators (e.g., foundries) and outsourced semiconductor assembly and test (OSAT) vendors (e.g., package/assembly OSAT vendors) may be seeking to develop ways to control package warpage and reduce a risk of underfill corner cracks and solder bump cracks, especially in large-die packages, with a low-cost solution.

One or more embodiments of the present disclosure may provide a hybrid adhesive solution for enhancing package reliability (e.g., large-die package reliability). The one or more embodiments may enhance package reliability by reducing stress concentration on the package underfill layer and bumps (e.g., solder bumps). Other methods may seek to optimize ring structure or change adhesive material to meet package warpage specifications. However, these other methods often cause underfill, bump or substrate crack issues. Various embodiments disclosed herein may utilize a hybrid adhesive solution to address former issues for package reliability enhancement. The hybrid adhesive solution may reduce in-plane stress by using a low modulus adhesive, and mitigate against warpage (e.g., out of plane stress) by using a high modulus adhesive. The term "modulus" may be understood to mean elastic modulus or modulus of elasticity.

Various embodiments may include, for example, a package structure (e.g., IC package) including a package substrate and a semiconductor die module connected to the package substrate. The semiconductor die module may include, for example, one or more semiconductor dies (e.g., silicon chips, top-dies, etc.) mounted on an interposer. The interposer may be connected to the package substrate by controlled collapse chip connection (C4) bumps and the package underfill layer may be formed between the interposer and the package substrate. A molding material layer may be formed on the semiconductor dies. The package structure may also include a ring structure on the package substrate around the semiconductor dies. An overall thickness of the ring structure may be in a range from 1 mm to 3 mm. The ring structure may have a bottom surface with a step shape. The ring structure may include an outer ring portion having an outer ring thickness (in the z-direction). The ring structure may also include an inner ring portion having an inner ring thickness different than the outer ring thickness. In at least one embodiment, the outer ring thickness may be greater than the inner ring thickness. In at least one embodiment, a width of the inner ring portion may be greater than a width of the outer ring portion.

The package structure may also include a hybrid adhesive attaching the ring structure to the package substrate. The hybrid adhesive may include an outer adhesive portion attaching the outer ring portion of the ring structure to the package substrate, and an inner adhesive portion attaching the inner ring portion of the ring structure to the package substrate. The outer adhesive portion may include a high modulus adhesive (e.g., bisphenol F-type epoxy resin 20% (±5%), TGAP resin 15% (±5%), filler 40%, and hardener 20%). The inner adhesive portion may include a low modulus adhesive (e.g., dimethyl siloxane 60%+ aluminum oxide filler 40%) having a modulus less than the high modulus adhesive. The high modulus adhesive may have a thickness less than a thickness of the low modulus adhesive (AD2). The high modulus adhesive may include a filler content greater than a filler content of the low modulus adhesive (AD2).

The high modulus adhesive may have a modulus greater than 1 GPa at 25° C. The low modulus adhesive may have a modulus less than 200 MPa at 25° C. That is, the low modulus adhesive may be "softer" than the high modulus adhesive. The high modulus adhesive may have a CTE greater than 20 ppm/° C. below Tg (i.e., glass transition temperature). The low modulus adhesive may have a CTE greater than 50 ppm/° C. over Tg. The high modulus adhesive may have a Tg greater than 100° C. The package torture temperature may have a maximum of about 125° C.

A width of the low modulus adhesive may be greater than a width of the high modulus adhesive by more than 10%. A thickness of the low modulus adhesive may be greater than a thickness of the high modulus adhesive by more than 10%. The outer ring thickness may be greater than the inner ring thickness by more than 10%. A parallelism (e.g., in-plane stress) of the ring structure may be controlled to be less than 0.15 mm. A flatness (e.g., out-of-plane stress) of the ring structure may be controlled to be less than 0.15 mm.

Thus, one or more embodiments may provide a hybrid adhesive solution and a ring structure (with a step-shaped bottom surface) to reduce shear stress and peeling stress concentration resulting from CTE mismatch, thereby enhancing package reliability. The embodiments may reduce stress without negatively impacting performance of package warpage control. The embodiments may include several features including the hybrid adhesive solution and/or the ring structure. The embodiments may be advantageous for large-die package structures (e.g., CoWoS, InFO-OS, etc.) where the ring structure may play an important role in controlling package warpage for a board-level solder jointing process.

In at least one embodiment, the ring structure (e.g., ring structure having a bottom with a step shape) may enhance performance of package warpage control, and the hybrid adhesive (e.g., high modulus adhesive combined with low modulus adhesive) may reduce thermo-mechanical stress concentration. The embodiments may be implemented, for example, with few changes to a manufacturing process (e.g., stamping press, drilling process, etc.). The embodiments may, therefore, enlarge yield of package reliability with little cost.

At least one embodiment may include a process for manufacturing the embodiment ring structure. The embodiment method may include providing a metal sheet (e.g., copper sheet, stainless steel sheet, etc.), stamping the metal sheet to form the ring structure, performing computer numerical control (CNC) milling to provide a bottom of the ring structure with a step shape, and then nickel plating the ring structure.

At least one embodiment may provide a process for attaching the ring structure to the package substrate. The process may include providing the package substrate (e.g., with or without a semiconductor die module mounted thereon), dispensing hybrid adhesive materials on the package substrate, placing the ring structure on the package substrate and at the same location as the adhesive, performing a hot clamping process to spread out the adhesive, and curing the adhesive to enhance adhesion between the ring structure and package substrate.

A distance between an inner sidewall of the ring structure and the semiconductor die module mounted on the package substrate may be greater than 5 mm. A package lid may also be mounted on the ring structure and on the semiconductor die module depending upon a design of the package structure.

Figure 1B:
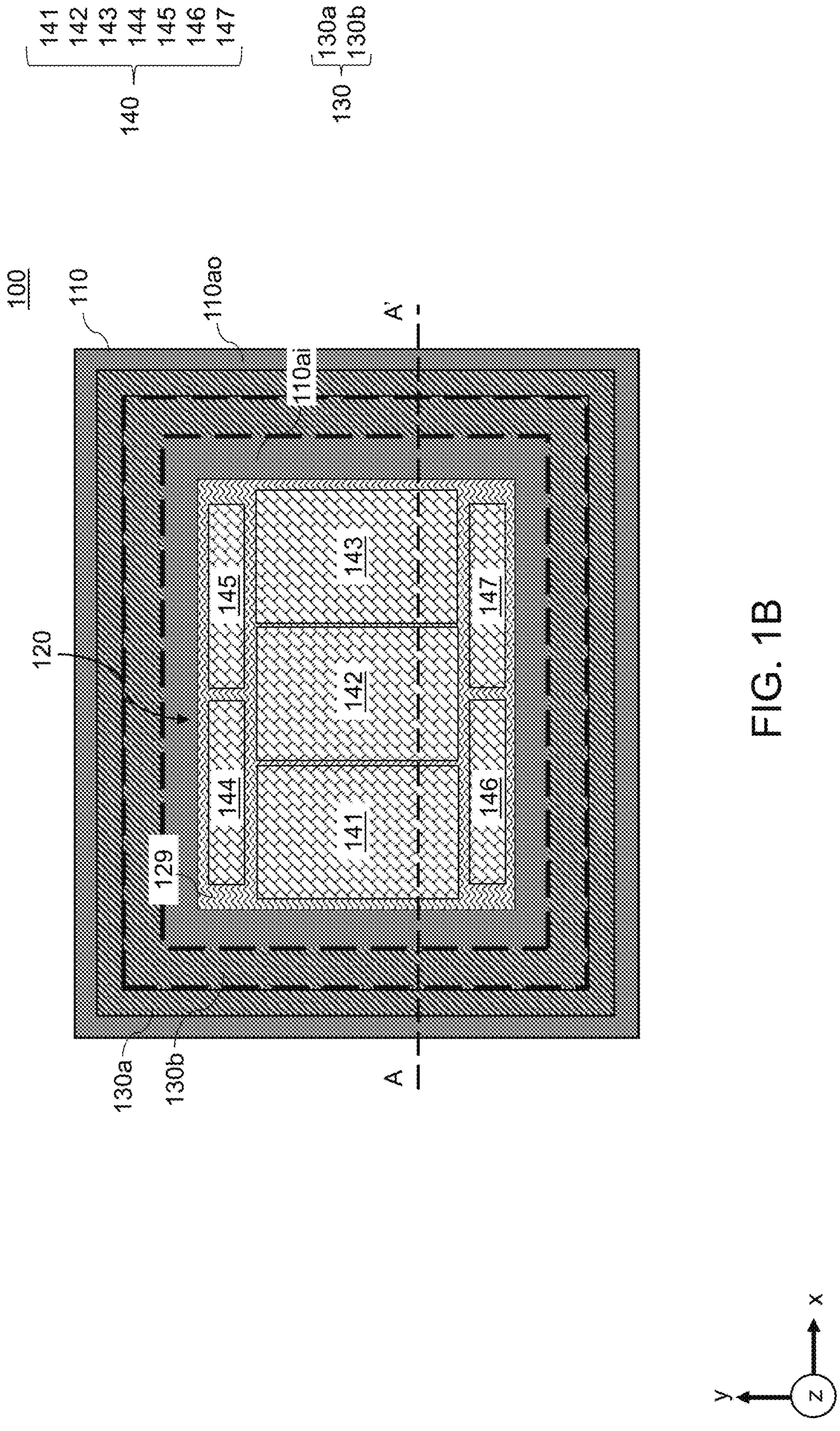
FIG. 1B is a plan view (e.g., top-down view) of the package structure according to one or more embodiments.

FIG. 1A is a vertical cross-sectional view of a package structure 100 (e.g., organic/silicon interposer package) according to one or more embodiments. FIG. 1B is a plan view (e.g., top-down view) of the package structure 100 according to one or more embodiments. The vertical cross-sectional view in FIG. 1A is along the line A-A' in FIG. 1B. The package structure 100 may include a first set of semiconductor dies including a first semiconductor die 141, second semiconductor die 142 and third semiconductor die 143. The package structure may also include a second set of semiconductor dies including a fourth semiconductor die 144, fifth semiconductor die 145, sixth semiconductor die 146, and seventh semiconductor die 147 (see FIG. 1B). The first set of semiconductor dies (141, 142, 143) may include, for example, primary dies (e.g., SOC die), and the second set of semiconductor dies (144, 145, 146, 147) may include ancillary dies (e.g, memory/SOC dies, HBM dies, etc.). The first semiconductor die 141, second semiconductor die 142, third semiconductor die 143, fourth semiconductor die 144, fifth semiconductor die 145, sixth semiconductor die 146 and seventh semiconductor die 147 may be referred to collectively as the semiconductor dies 140 (see FIG. 1B).

Although the package structure 100 is illustrated as including a particular number of semiconductor dies 140 having a particular arrangement, the number of semiconductor dies 140 and the arrangement of the semiconductor dies 140 is not limited to any particular number and arrangement. In particular, the package structure 100 may include any number and arrangement of semiconductor dies 140 and any number and arrangement of semiconductor die sets.

Referring to FIGS. 1A and 1B, the package structure 100 may include a package substrate 110 and a semiconductor die module 120 including the semiconductor dies 140 mounted on the package substrate 110. The package structure 100 may further include a ring structure 130 on the package substrate 110 adjacent to the semiconductor die module 120. The ring structure 130 may be attached to the package substrate 110 by a hybrid adhesive 160 having a plurality of moduli. The package structure 100 may include, for example, a chip-on-wafer-on-substrate (CoWoS®) design, an integrated fan-out (InFO-oS) design, etc.

The package substrate 110 may include a cored or coreless substrate. In at least one embodiment, for example, the package substrate 110 may include a core 112, a package substrate upper dielectric layer 114 formed on the core 112 (e.g., a first side or chip-side of the package substrate 110), and a package substrate lower dielectric layer 116 formed on the core 112 (e.g., a second side or board-side of the package substrate 110). In particular, the package substrate 110 may include a build-up film substrate such as an Ajinomoto build-up film (ABF) substrate. That is, in at least one embodiment, each of the package substrate upper dielectric layer 114 and the package substrate lower dielectric layer 116 may be described as an ABF layer.

The core 112 may help to provide rigidity to the package substrate 110. The core 112 may include, for example, an epoxy resin such as a bismaleimide triazine epoxy (BT epoxy) and/or a woven glass laminate. The core 112 may alternatively or in addition include an organic material such as a polymer material. In particular, the core 112 may include a dielectric polymer material such as polyimide (PI), benzocyclo-butene (BCB), or polybenzobisoxazole (PBO). Other suitable dielectric materials are within the contemplated scope of disclosure.

The core 112 may include one or more through vias 112*a*. The through vias 112*a* may extend from a lower surface of the core 112 to an upper surface of the core 112. The through vias 112*a* may allow an electrical connection between the package substrate upper dielectric layer 114 and the package substrate lower dielectric layer 116. The through vias 112*a* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

The package substrate upper dielectric layer 114 may be formed on an upper surface of the core 112. The package substrate upper dielectric layer 114 may include a plurality of layers and, in particular, may include a build-up film (e.g., ABF). The package substrate upper dielectric layer 114 may also include an organic material such as a polymer material. In particular, the package substrate upper dielectric layer 114 may include a dielectric polymer material such as polyimide (PI), benzocyclobutene (BCB), or polybenzobisoxazole (PBO). Other suitable dielectric materials are within the contemplated scope of disclosure.

The package substrate upper dielectric layer 114 may include one or more package substrate upper bonding pads 114*a* on a chip-side surface of the package substrate upper dielectric layer 114. In particular, the package substrate upper bonding pads 114*a* may be exposed on the chip-side surface of the package substrate upper dielectric layer 114. The package substrate upper dielectric layer 114 may also include one or more metal interconnect structures 114*b*. The metal interconnect structures 114*b* may be connected to the package substrate upper bonding pads 114*a* and the through vias 112*a* in the core 112. The metal interconnect structures 114*b* may include metal layers (e.g., copper traces) and metal vias connecting the metal layers. The package substrate upper bonding pads 114*a* and the metal interconnect structures 114*b* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A package substrate upper passivation layer 110*a* may be formed on the chip-side surface of the package substrate upper dielectric layer 114. The package substrate upper passivation layer 110*a* may partially cover the package substrate upper bonding pads 114*a*. The upper passivation layer 114*a* may include silicon oxide, silicon nitride, low-k dielectric materials such as carbon-doped oxides, extremely low-k dielectric materials such as porous carbon doped silicon dioxide, a combination thereof or other suitable material.

The package substrate lower dielectric layer 116 may be formed on a lower surface of the core 112. The package substrate lower dielectric layer 116 may also include a plurality of layers and, in particular, may include a build-up film (e.g., ABF). The package substrate lower dielectric layer 116 may also include an organic material such as a polymer material. In particular, the package substrate lower dielectric layer 116 may include a dielectric polymer material such as polyimide (PI), benzocyclobutene (BCB), or polybenzobisoxazole (PBO). Other suitable dielectric materials are within the contemplated scope of disclosure.

The package substrate lower dielectric layer 116 may include one or more package substrate lower bonding pads 116*a* on a board-side surface of the package substrate lower dielectric layer 116. In particular, the package substrate lower bonding pads 116*a* may be exposed on the board-side surface of the package substrate lower dielectric layer 116. The package substrate lower dielectric layer 116 may also include one or more metal interconnect structures 116*b*. The metal interconnect structures 116*b* may be connected to the package substrate lower bonding pads 116*a* and the through vias 112*a* in the core 112. The metal interconnect structures 116*b* may include metal layers (e.g., copper traces) and metal vias connecting the metal layers. The package substrate lower bonding pads 116*a* and the metal interconnect structures 116*b* may include, for example, one or more layers and may include metals, metal alloys, and/or other metal-containing compounds (e.g., Cu, Al, Mo, Co, Ru, W, TIN, TaN, WN, etc.). Other suitable metal materials are within the contemplated scope of disclosure.

A package substrate lower passivation layer 110*b* may be formed on the board-side surface of the package substrate lower dielectric layer 116. The package substrate lower passivation layer 110*b* may partially cover the package substrate lower bonding pads 116*a*. The package substrate lower passivation layer 110*b* may include silicon oxide, silicon nitride, low-k dielectric materials such as carbon-doped oxides, extremely low-k dielectric materials such as porous carbon doped silicon dioxide, a combination thereof or other suitable material.

A ball-grid array (BGA) including a plurality of solder balls 110*c* may be formed on the board-side surface of the package substrate lower dielectric layer 116. The solder balls 110*c* may allow the package structure 100 to be securely mounted (e.g., by surface mount technology (SMT)) on a substrate such as a printed circuit board (PCB) and electrically coupled to the PCB substrate. The solder balls 110*c* may contact the package substrate lower bonding pads 116*a*, respectively. The solder balls 110*c* may therefore be electrically connected to the package substrate upper bonding pads 114*a* by way of metal interconnect structures 116*b*, the through vias 112*a* and the metal interconnect structures 114*b*.

The solder balls 110*c* of the BGA may include a solder material including one or more of tin, copper, silver, bismuth, indium, zinc, and antimony. In particular, the solder material may include a tin-silver-copper alloy including about 3-4% silver, 0.5-0.7% copper, and the balance (95% or more) tin. A fourth metal such as zinc or manganese may be added to the tin-silver-copper alloy. The solder material may have a melting point in a range from 90° C. to 450° C., and more particularly, in a range from about 220° C. to 260° C.

The semiconductor die module 120 may be mounted by C4 bumps 121 on the package substrate upper bonding pads 114*a* in the package substrate 110. A package underfill layer 129 may be formed under and around the semiconductor die module 120 and the C4 bumps 121 so as to fix the semiconductor die module 120 to the package substrate 110. The package underfill layer 129 may be formed of an epoxy-based polymeric material.

The semiconductor die module 120 may include an interposer 10 having a redistribution layer (RDL) structure. The interposer 10 may be electrically coupled to the package substrate 110 by the C4 bumps 121. The semiconductor dies 140 (see FIG. 1B) may be mounted on the interposer 10.

The interposer 10 is not necessarily limited to any particular materials or configuration. The interposer 10 may include, for example, organic material (e.g., dielectric polymer), inorganic material (e.g., silicon), glass substrate, etc. In at least one embodiment, the interposer 10 may include a plurality of polymer layers 12 and a plurality of redistribution layers 12*a* stacked alternately. The number of the polymer layers 12 and/or the number of redistribution layers 12*a* in the interposer 10 are not limited by the disclosure. While the interposer 10 is shown to have three (3) polymer layers 12, a greater or fewer number of layers may be used.

In at least one embodiment, the polymer layers 12 may include, for example, polyimide (PI), epoxy resin, acrylic resin, phenol resin, benzocyclobutene (BCB), polybenzoxazole (PBO), or any other suitable polymer-based dielectric material. In some embodiments, the redistribution layers 12*a* may include conductive materials. The conductive materials may include metal such as copper, aluminum, nickel, titanium, a combination thereof or other suitable metals.

The redistribution layers 12*a* may include metallic connection structures, i.e., metallic structures that provide electrical connection between nodes in the structure. The redistribution layers 12*a* may include a metallic seed layer and a metallic fill material on the metallic seed layer. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution layers 12*a* may include copper, nickel, or copper and nickel. Other suitable metallic fill materials are within the contemplated scope of disclosure. The thickness of the metallic fill material that is deposited for each redistribution layers 12*a* may be in a range from 2 microns to 40 microns, such as from 4 microns to 10 microns, although lesser or greater thicknesses may also be used.

In at least one embodiment, the redistribution layers 12*a* may include a plurality of traces (lines) and a plurality of vias connecting the plurality traces to each other. The traces may be respectively located on the polymer layers 12 and may extend in the x-direction (first horizontal direction) and y-direction (second horizontal direction) on an upper surface of the polymer layers 12.

An upper passivation layer 13 may be formed on the chip-side surface of the interposer 10. The upper passivation layer 13 may include silicon oxide, silicon nitride, low-k dielectric materials such as carbon-doped oxides, extremely low-k dielectric materials such as porous carbon doped silicon dioxide, a combination thereof or other suitable material.

One or more interposer upper bonding pads 13*a* may be located in the upper passivation layer 13 on the chip-side surface of interposer 10. The upper passivation layer 13 may at least partially cover the interposer upper bonding pads 13*a*. That is, the interposer upper bonding pads 13*a* may be at least partially exposed on the chip-side surface of the interposer 10. The interposer upper bonding pads 13*a* may be connected to the redistribution layers 12*a*. The interposer upper bonding pads 13*a* may include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

A lower passivation layer 14 may be formed on the board-side surface of the interposer 10. The lower passivation layer 14 may also include silicon oxide, silicon nitride, low-k dielectric materials such as carbon-doped oxides, extremely low-k dielectric materials such as porous carbon doped silicon dioxide, a combination thereof or other suitable material.

One or more interposer lower bonding pads 14*a* may be located on the board-side surface of interposer 10. The interposer lower bonding pads 14*a* may be bonded to and electrically connected to the redistribution layers 12*a*. The interposer lower bonding pads 14*a* may be located in the lower passivation layer 14. The lower passivation layer 14 may at least partially cover the interposer lower bonding pads 14*a*. That is, the interposer lower bonding pads 14*a* may be at least partially exposed on the board-side surface of the interposer 10. The interposer lower bonding pads 14*a* may also include, for example, one or more layers and may include metals, metal alloys, and/or other metal-containing compounds (e.g., Cu, Al, Mo, Co, Ru, W, TiN, TaN, WN, etc.). Other suitable metal materials are within the contemplated scope of disclosure.

One or more integrated passive devices (IPDs) (not shown) may optionally be located on the board-side surface of interposer 10. The IPDs may be bonded to and electrically connected to the redistribution layers 12*a*. The IPDs may be located in the lower passivation layer 14. The IPDs may include an exposed portion that projects out from the lower passivation layer. The IPDs may include one or more electronic components such as resistors, capacitors, inductors, coils, chokes, microstriplines, impedance matching elements, baluns, etc. The IPDs may be electrically coupled to the semiconductor dies 140 through the interposer 10.

The semiconductor dies 140 may be mounted on the interposer 10 by micro-bumps 128 that may be bonded to the interposer upper bonding pads 13*a*. The semiconductor dies 140 may therefore be electrically coupled to the metal interconnects 12*a* by the microbumps 128.

An interposer underfill layer 126 may be formed around the microbumps 128 and between the semiconductor dies 140 and the interposer 10. The interposer underfill layer 126 may be formed separately under each of the semiconductor dies 140. Alternatively, the interposer underfill layer 126 may be formed continuously as one layer under all of the semiconductor dies 140. The interposer underfill layer 126 may also be formed between each of the semiconductor dies 140 as illustrated in FIG. 1A. The interposer underfill layer 126 may also be formed of an epoxy-based polymeric material.

Each of the semiconductor dies 140 may include, for example, a singular semiconductor die, a system on chip (SOC) die, or a system on integrated chips (SoIC) die, and may be implemented by chip on wafer on substrate (CoWoS) technology or integrated fan-out on substrate (INFO-oS) technology. In particular, each of the semiconductor dies 140 may include, for example, a semiconductor chip or chiplet for a high performance computing (HPC) application, an artificial intelligence (AI) application, and a 5G cellular network application, a logic die (e.g., mobile application processor, microcontroller, etc.), or a memory die (e.g., high-bandwidth memory (HBM) die, hybrid memory cube (HMC), dynamic random access memory (DRAM) die, a Wide I/O die, a M-RAM die, a R-RAM die, a NAND die, static random access memory (SRAM), etc.), a central processing unit (CPU) chip, graphics processing unit (GPU) chip, field-programmable gate array (FPGA) chip, networking chip, application-specific integrated circuit (ASIC) chip, artificial intelligence/deep neural network (AI/DNN) accelerator chip, etc., a co-processor, accelerator, an on-chip memory buffer, a high data rate transceiver die, a I/O interface die, an IPD die, a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), a monolithic 3D heterogeneous chiplet stacking die, etc. Other dies are within the contemplated scope of this disclosure.

The semiconductor die module 120 may also include an upper molding material layer 127 formed around the semiconductor dies 140. The upper molding material layer 127 may also be formed on and around the interposer underfill layer 126. In at least one embodiment, the upper molding material layer 127 may be formed on sidewalls (inner sidewall and outer sidewall) of each of the semiconductor dies 140. The upper molding material layer 127 may be formed between and bonded to the sidewalls of each of the semiconductor dies 140. The upper molding material layer 127 may have an outer sidewall that is substantially aligned with the outer sidewall of the interposer 10. The molding material layer 127 may be formed, for example, of an epoxy molding compound (EMC).

The package structure 100 may also include a ring structure 130 that may be fixed to the package substrate 110 adjacent to the semiconductor die module 120. The ring structure may provide rigidity to the package substrate 110. The ring structure 130 may be formed, for example, of metal, ceramic or polymer material. In at least one embodiment, the ring structure 130 may be formed of a metal such as copper with a nickel coating, or an aluminum alloy. Other suitable metal materials for use in the ring structure 130 are within the contemplated scope of disclosure.

The ring structure 130 may include an outer ring structure portion 130*a* and inner ring structure portion 130*b* located between the outer ring structure portion 130*a* and the semiconductor die module 120. The inner ring structure portion 130*b* may be integrally joined to the outer ring structure portion 130*a*, so that the inner ring structure portion 130*b* and outer ring structure portion 130*a* may be formed as a unit. The outer ring structure portion 130*a* may have a thickness greater than a thickness of the inner ring structure portion 130*b*. In other embodiments, as shown in FIG. 1A, the outer ring structure portion 130*a* may have a thickness lesser than a thickness of the inner ring structure portion 130*b*. The ring structure 130 may have a step-shaped bottom surface $S_{130}$ including a bottom surface $S_{130a}$ of the outer ring structure portion 130*a* and a bottom surface $S_{130b}$ of the inner ring structure portion 130*b*.

The ring structure 130 may be fixed to the package substrate 110 by an adhesive 160. The adhesive 160 may include a hybrid adhesive that includes a plurality of different adhesive materials having different physical properties. In at least one embodiment, the adhesive 160 may include both an epoxy-based adhesive and a silicone-based adhesive. Other adhesives are within the contemplated scope of this disclosure. In at least one embodiment, the adhesive 160 may include an outer adhesive portion 160*a* that adheres the bottom surface $S_{130a}$ of the outer ring structure portion 130*a* to the package substrate 110, and an inner adhesive portion 160*b* that adheres the bottom surface $S_{130b}$ of the inner ring structure portion 130*b* to the package substrate 110.

In at least one embodiment, the outer adhesive portion 160*a* may include a high modulus adhesive such as an epoxy-based adhesive. The outer adhesive portion 160*a* may have a modulus greater than 1 GPa at 25° C. The outer adhesive portion 160*a* may have a CTE greater than 20 ppm/° C. below Tg (i.e., glass transition temperature). The outer adhesive portion 160*a* may have a Tg greater than 100° C.

The high modulus adhesive comprising the outer adhesive portion 160*a* may include one or more different phenolic resins. In at least one embodiment, the high modulus adhesive may include a combination of bisphenol F-type epoxy resin and triglycidyl-2 aminophenol (TGAP) resin. In at least one embodiment, the high modulus adhesive may include about 20% (±5%) bisphenol F-type epoxy resin and about 15% (±5%) triglycidyl-2 aminophenol (TGAP) resin. In particular, the high modulus adhesive may include a mixture of bisphenol F-type epoxy resin 20% (±5%), triglycidyl-2 aminophenol (TGAP) resin 15% (±5%), filler 40%, and hardener 20%).

The inner adhesive portion 160*b* may have physical properties that are different than the physical properties of the outer adhesive portion 160*a*. In particular, the inner adhesive portion 160*b* may have a modulus that is different than the modulus of the outer adhesive portion 160*a*. In at least one embodiment, the inner adhesive portion 160*b* may have a modulus that is less than the modulus of the outer adhesive portion 160*a*. In at least one embodiment, the outer adhesive portion 160*a* may have a modulus that is at least twice the modulus of the inner adhesive portion 160*b*. The inner adhesive portion 160*b* may be "softer" than the outer adhesive portion 160*a*. The inner adhesive portion 160*b* may have a modulus less than 200 MPa at 25° C. The inner adhesive portion 160*b* may have a CTE greater than 50 ppm/° C. over Tg. The package torture temperature may have a maximum of about 125° C.

In at least one embodiment, the inner adhesive portion 160*b* may include a low modulus adhesive such as a silicone-based adhesive. The low modulus adhesive comprising the inner adhesive portion 160*b* may include one or more different polysiloxane resins. In at least one embodiment, the low modulus adhesive may include dimethyl siloxane. The low modulus adhesive may also include a filler. The filler content of the low modulus adhesive may be less than the filler content of the high modulus adhesive. In at least one embodiment, the low modulus adhesive may include a mixture of dimethyl siloxane 60% and aluminum oxide filler 40%.

As illustrated in FIG. 1B, the ring structure 130 may be formed on the package substrate 110 so as to laterally surround the semiconductor die module 120 in a first horizontal direction (e.g., the x-direction) and a second horizontal direction (e.g., y-direction). In the plan view of FIG. 1B, the outer ring structure portion 130*a* may be separated from an outer edge of the package substrate 110 by an outer package substrate upper passivation layer portion 110*ao*. A width of the outer package substrate upper passivation layer portion 110*ao* may be substantially uniform around the entire periphery of the outer ring structure portion 130*a*. The inner ring structure portion 130*b* may be separated from the semiconductor die module 120 (e.g., from the package underfill layer 129) by an inner package substrate upper passivation layer portion 110*ai*. A width of the inner package substrate upper passivation layer portion 110*ao* may be substantially uniform around the entire periphery of the semiconductor die module 120.

The semiconductor die module 120 may be arranged in the package structure 100 so that a longitudinal direction of the semiconductor die module 120 is aligned with a longitudinal direction of the package substrate 110. The semiconductor dies 140 may be arranged in the semiconductor die module 120 so that the first set of semiconductor dies (e.g., first semiconductor die 141, second semiconductor die 142, third semiconductor die 143) are centrally located in a direction perpendicular to the longitudinal direction of the semiconductor die module 120 (e.g., in the y-direction). The second set of semiconductor dies (e.g., fourth semiconductor die 144, fifth semiconductor die 145, sixth semiconductor die 146 and seventh semiconductor die 147) may be located on opposing sides of the first set of semiconductor dies in the direction perpendicular to the longitudinal direction of the semiconductor die module 120.

As further illustrated in FIG. 1B, a shape of the ring structure 130 in the plan view may be substantially the same as a shape of the package substrate 110. The ring structure 130 may have a square shape or rectangle shape in the plan view. Other suitable shapes of the ring structure 130 may be within the contemplated scope of disclosure. For example, the ring structure 130 may have a circular, oval, hexagonal, octagonal, polygonal shape.

Figure 1C:
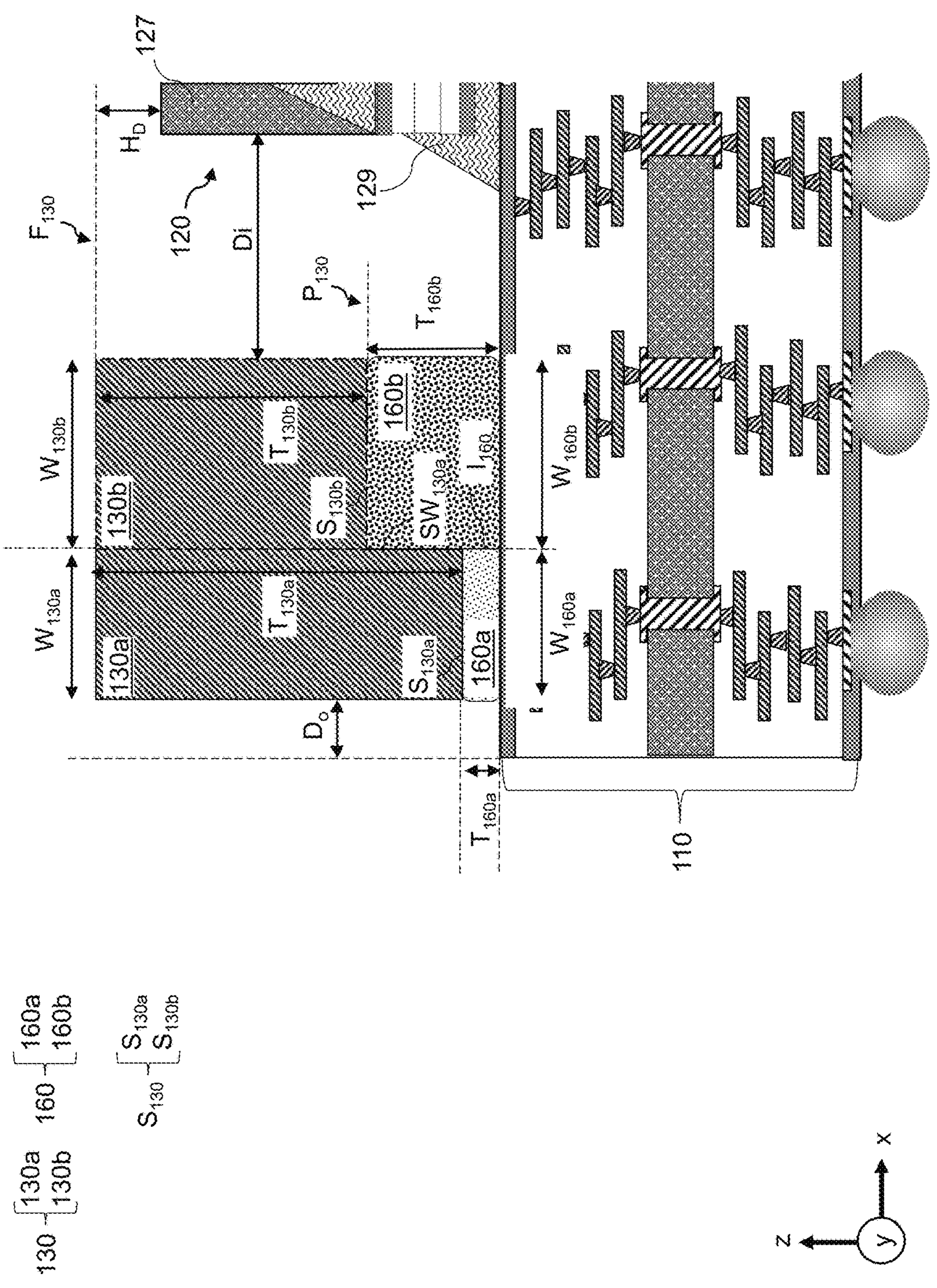
FIG. 1C is a detailed vertical cross-sectional view of the ring structure and adhesive according to one or more embodiments.

FIG. 1C is a detailed vertical cross-sectional view of the ring structure 130 and adhesive 160 according to one or more embodiments. As illustrated in FIG. 1C, an upper surface of the ring structure 130 may be substantially uniform over a width (in the x-direction) of the ring structure 130. The upper surface of the ring structure 130 may have a height (in the z-direction) as measured from an upper surface of the package substrate 110 that is greater than a height of an upper surface of the semiconductor die module 120. In particular, a height difference $H_D$ between the height of the upper surface of the semiconductor die module 120 and the height of the upper surface of the ring structure 130 may be 0.1 mm or greater. In at least one embodiment, a package lid may optionally be mounted on the upper surface of the ring structure 130 and on the upper surface of the semiconductor die module 120 (e.g., through a thermal interface material (TIM) layer) depending upon a design of the package structure 100.

An inner sidewall of the ring structure 130 may be separated from the semiconductor die module 120 (e.g., from the molding material layer 127) by an inner distance Di. In at least one embodiment, the inner distance Di may be greater than 5 mm. An outer sidewall of the ring structure 130 may be separated from an outer sidewall of the package substrate 110 by an outer distance Do that may be less than the inner distance Di. In at least one embodiment, the outer distance Do may be in a range from 5% to 50% of the inner distance Di.

A flatness (e.g., out-of-plane stress) of the upper surface of the ring structure 130 may be controlled to be less than 0.15 mm. The upper surface of the ring structure 130 may include an upper surface of the outer ring structure portion 130*a* and an upper surface of the inner ring structure portion 130*b*. The upper surface of the outer ring structure portion 130*a* may be substantially coplanar with the upper surface of the inner ring structure portion 130*b*. The bottom surface $S_{130b}$ of the inner ring structure portion 130*b* may be substantially parallel with the upper surface of the package substrate 110. A parallelism (e.g., in-plane stress) of the ring structure 130 as measured between the bottom surface $S_{130b}$ of the inner ring structure portion 130*b* and the upper surface of the package substrate 110, may be controlled to be less than 0.15 mm.

The outer ring structure portion 130*a* may have a thickness $T_{130a}$ (in the z-direction) in a range from 1 mm to 3 mm. That is, the ring structure 130 may have an overall thickness in a range from 1 mm to 3 mm. The outer ring structure portion 130*a* may have a width $W_{130a}$ (in the x-direction) less than the thickness $T_{130a}$. In at least one embodiment, the width $W_{130a}$ may be in a range from 10% to 50% of the thickness $T_{130a}$. In at least one embodiment, the width $W_{130a}$ may be in a range from 0.1 mm to 1.5 mm.

The inner ring structure portion 130*b* may have a thickness $T_{130b}$ that is less than the thickness $T_{130a}$ of the outer ring structure portion 130*a*. In at least one embodiment, the thickness $T_{130a}$ of the outer ring structure portion 130*a* may be greater than the thickness $T_{130b}$ of the inner ring structure portion 130*b* by more than 10%. The inner ring structure portion 130*b* may have a width $W_{130b}$ (in the x-direction) greater than the width $W_{130a}$ of the outer ring structure portion 130*a*. In at least one embodiment, the width $W_{130b}$ of the inner ring structure portion 130*b* may be greater than the width $W_{130a}$ of the outer ring structure portion 130*a* by more than 10%. The width $W_{130b}$ of the inner ring structure portion 130*b* may be less than the thickness $T_{130b}$ of the inner ring structure portion 130*b* In at least one embodiment, the width $W_{130b}$ may be in a range from 20% to 60% of the thickness $T_{130b}$. In at least one embodiment, the width $W_{130b}$ may be in a range from 0.1 mm to 1.5 mm.

The overall thickness of the adhesive 160 may be less than the overall thickness of the ring structure 130. An overall width (in the x-direction) of the adhesive 160 may be substantially the same as an overall width of the ring structure 130. A thickness $T_{160a}$ of the outer adhesive portion 160*a* may be less than the thickness $T_{130a}$ of the outer ring structure portion 130*a*. A width $W_{160a}$ of the outer adhesive portion 160*a* may be substantially the same as a width $W_{130a}$ of the outer ring structure portion 130*a*. A thickness $T_{160b}$ of the inner adhesive portion 160*b* may be less than the thickness $T_{130b}$ of the inner ring structure portion 130*b*. A width $W_{160b}$ of the inner adhesive portion 160*b* may be substantially the same as a width $W_{130b}$ of the inner ring structure portion 130*b*.

At least a portion of the inner adhesive portion 160*b* may contact and bond to an inner sidewall $SW_{130a}$ of the outer ring structure portion 130*a*. The thickness $T_{160b}$ of the inner adhesive portion 160*b* may be greater than the thickness $T_{160a}$ of the outer adhesive portion 160*b*. In at least one embodiment, the thickness $T_{160b}$ of the inner adhesive portion 160*b* may be greater than the thickness $T_{160a}$ of the outer adhesive portion 160*a* by more than 10%. The width $W_{160b}$ of the inner adhesive portion 160*b* may be greater than the width $W_{160a}$ of the outer adhesive portion 160*a*. In at least one embodiment, the width $W_{160b}$ of the inner adhesive portion 160*b* may be greater than the width $W_{160a}$ of the outer adhesive portion 160*a* by more than 10%.

In at least one embodiment, a thickness $T_{130a}$ of the outer ring structure portion 130*a* (i.e., an overall thickness of the ring structure 130) may be in a range from 100 μm to 1000 μm (e.g., about 500 μm), and a width $W_{130a}$ of the outer ring structure portion 130*a* may be in a range from 2600 μm to 3200 μm (e.g., about 2940 μm). A thickness $T_{130b}$ of the inner ring structure portion 130*b* may be in a range from 150 μm to 350 μm (e.g., about 250 μm), and width $W_{130b}$ of the inner ring structure portion 130*b* may be in a range from 3400 μm to 4000 μm (e.g., about 3675 μm). A width $W_{160a}$ of the outer adhesive portion 160*a* may be substantially the same as the width $W_{130a}$ of the outer ring structure portion 130*a*, and a width $W_{160b}$ of the inner adhesive portion 160*b* may be substantially the same as the width $W_{130b}$ of the inner ring structure portion 130*b*. A thickness $T_{160a}$ of the outer adhesive portion 160*a* may be in a range from 50 μm to 150 μm (e.g., about 100 μm), and a thickness $T_{160b}$ of the inner adhesive portion 160*b* may be in a range from 300 μm to 400 μm (e.g., about 350 μm).

As illustrated in FIG. 1C, an interface 1160 may be formed between the outer adhesive portion 160*a* and the inner adhesive portion 160*b*. The interface $I_{160}$ may be substantially aligned with the inner sidewall $SW_{130a}$ of the outer ring structure portion 130*a*.

The adhesive 160 (e.g., hybrid adhesive) may reduce in-plane stress by including the inner adhesive portion 160*b* (e.g., a low modulus adhesive), and control warpage (e.g., out of plane stress) by including the outer adhesive portion 160*a* (e.g., a high modulus adhesive). The package structure 100 may thereby reduce stress without negatively impacting performance of package warpage control.

FIGS. 2A-4G illustrate various intermediate structures in a method making the package structure 100. In particular, FIGS. 2A-2D illustrate various intermediate structures in a method making the ring structure 130 of the package structure 100. FIGS. 3A-3E illustrate various intermediate structures in a method making the semiconductor die module 120 of the package structure 100. FIGS. 4A-4G illustrate various intermediate structures in a method making the package structure 100.

FIG. 2A is a plan view (e.g., top-down view) of an intermediate structure including a metal sheet 230, according to one or more embodiments. The metal sheet 230 may include, for example, a metal material such as copper or copper alloy. Other metal materials are within the contemplated scope of this disclosure. An outer shape of the metal sheet 230 may include a rectangular shape. Other shapes are within the contemplated scope of disclosure. The outer shape of the metal sheet 230 may be substantially the same as the outer shape of the outer ring structure portion 130*a* (see FIG. 1B). The dimensions of the metal sheet 230 in the x-direction and in the y-direction may be substantially the same as the dimensions of the outer ring structure portion 130*a* (see FIG. 1B) in the x-direction and in the y-direction, respectively.

A thickness (in the z-direction) of the metal sheet 230 may be substantially uniform over the entire area of the metal sheet 230. The thickness of the metal sheet 230 may be substantially the same as the thickness $T_{130a}$ of the outer ring structure portion 130*a* (see FIG. 1C). In at least one embodiment, the thickness of the metal sheet 230 may be in a range from 1 mm to 3 mm.

FIG. 2B is a plan view (e.g., top-down view) of an intermediate structure including the metal sheet 230 having a frame shape, according to one or more embodiments. The metal sheet 230 in FIG. 2A may be stamp pressed to form the frame-shaped metal sheet 230 in FIG. 2B. In particular, the metal sheet 230 in FIG. 2A may be stamp pressed using a stamping press to form the frame-shaped metal sheet 230. In particular, the stamping press may include at least a 60-ton stamping press.

FIG. 2C is a plan view (e.g., top-down view) of an intermediate structure including the metal sheet 230 including an outer metal sheet portion 230*a* and an inner metal sheet portion 230*b*, according to one or more embodiments. The shape and dimensions of the outer metal sheet portion 230*a* and the inner metal sheet portion 230*b*, may be substantially the same as the shape and dimensions of the ring structure 130 in FIGS. 1A-1C. The inner metal sheet portion 230*b* may be formed by reducing a thickness (in the z-direction) of an inner portion of the frame-shaped metal sheet 230 in FIG. 2B. The thickness of the inner metal sheet portion 230*b* may be reduced, for example, by a milling machine. In at least one embodiment, the thickness of the inner metal sheet portion 230*b* may be reduced by a computer numerical control (CNC) milling machine. The frame-shaped metal sheet 230 may or may not be milled to form the outer metal sheet portion 230*a*. In at least one embodiment, the outer metal sheet portion 230*a* may be formed as a result of forming the inner metal sheet portion 230*b*.

FIG. 2D is a plan view (e.g., top-down view) of an intermediate structure including the ring structure 130 having the outer ring structure portion 130*a* and the inner ring structure portion 130*b*, according to one or more embodiments. The ring structure 130 in FIG. 2D may be formed by performing a plating process on the metal sheet 230 including the outer metal sheet portion 230*a* and inner metal sheet portion 230*b* in FIG. 2C. The plating process may apply a metal plating layer to a surface (e.g., entire surface) of the metal sheet 230. A material of the metal plating layer may include, for example, nickel. Other materials are within the contemplated scope of disclosure. The metal plating layer may increase the strength of the ring structure 130 and enhance the corrosion resistance of the ring structure 130. The plating process may include, for example, an electroless metal plating process.

FIG. 3A is a vertical cross-sectional view of an intermediate structure including a portion of the interposer 10 (e.g., organic interposer) formed on a first carrier substrate 1 (e.g., carrier wafer) according to an embodiment of the present invention. The lower passivation layer 14 and interposer lower bonding pads 14*a* of the interposer 10 may be formed later in the method of forming the semiconductor die module 120.

The first carrier substrate 1 may include a circular wafer or a rectangular wafer. The lateral dimensions (such as the diameter of a circular wafer or a side of a rectangular wafer) of the first carrier substrate 1 may be in a range from 100 mm to 500 mm, such as from 200 mm to 400 mm, although lesser and greater lateral dimensions may also be used. The first carrier substrate 1 may include a semiconductor substrate, an insulating substrate, or a conductive substrate. The first carrier substrate 1 may be transparent or opaque. A thickness of the first carrier substrate 1 may be sufficient to provide mechanical support to an array of interposers to be formed thereupon. For example, the thickness of the first carrier substrate 1 may be in a range from 60 microns to 1 mm, although lesser and greater thicknesses may also be used.

An adhesive layer (not shown) may be applied to the top surface of the first carrier substrate 1. In at least one embodiment, the first carrier substrate 1 may include an optically transparent material such as glass or sapphire. In this embodiment, the adhesive layer may include a light-to-heat conversion (LTHC) layer. The LTHC layer is a solvent-based coating applied using a spin coating method. The LTHC layer may form a layer that converts ultraviolet light to heat such that the LTHC layer loses adhesion. Alternatively, the adhesive layer may include a thermally decomposing adhesive material. For example, the adhesive layer may include an acrylic pressure-sensitive adhesive that decomposes at an elevated temperature. The debonding temperature of the thermally decomposing adhesive material may be in a range from 150° C. to 400° C. Other suitable thermally decomposing adhesive materials that decompose at other temperatures are within the contemplated scope of disclosure.

A plurality of dielectric layers 12 and plurality of redistribution layers 12*a* may be alternately formed on the first carrier substrate 1 (e.g., on the adhesive layer on the first carrier substrate 1). It should be noted that although FIG. 3A illustrates three dielectric layers 12 and three redistribution layers 12*a*, more or fewer dielectric layers 12 and redistribution layers 12*a* are contemplated by the present disclosure.

Each dielectric layer 12 may each be formed, for example, by depositing (e.g., by CVD, PVD or other suitable deposition technique) a layer of dielectric polymer material such as polyimide (PI), benzocyclobutene (BCB), or polybenzobisoxazole (PBO). Other suitable materials are within the contemplated scope of disclosure. The thickness of the layer of dielectric polymer material may be in a range from 4 microns to 60 microns, although lesser and greater thicknesses may also be used. The dielectric layer 12 may then be patterned by a photolithographic process to form via holes in the dielectric layer 12. The photolithographic process may include forming a patterned photoresist mask (not shown) on the layer of dielectric material, and etching (e.g., wet etching, dry etching, etc.) the exposed upper surface of the dielectric material through openings in the photoresist mask. The photoresist mask may be subsequently removed by ashing, dissolving the photoresist mask or by consuming the photoresist mask during the etch process.

A redistribution layer 12*a* (e.g., metal traces and metal vias) may then be formed on the dielectric layer 12. The redistribution layer 12*a* may be formed, for example, by depositing (e.g., by CVD, PVD or other suitable deposition technique) one or more layers of metal material such as copper, aluminum, nickel, titanium, a combination thereof or other suitable metals, on the dielectric layer 12 and in the vias holes formed by patterning the dielectric layer 12. The redistribution layer 12*a* may then be patterned by a photolithographic process. The photolithographic process may include forming a patterned photoresist mask (not shown) on the layer of metal material, and etching (e.g., wet etching, dry etching, etc.) the exposed upper surface of the metal material through openings in the photoresist mask. The photoresist mask may be subsequently removed by ashing, dissolving the photoresist mask or by consuming the photoresist mask during the etch process.

As further illustrated in FIG. 3A, the interposer upper bonding pads 13*a* may then be formed on the uppermost dielectric layer 12. The interposer upper bonding pads 13*a* may include any metallic material that may be bonded to a solder material. The interposer upper bonding pads 13*a* may be formed by depositing (e.g., by CVD, PVD or other suitable deposition technique) one or more metal layers including a metal, metal alloys, and/or other metal-containing compounds (e.g., Cu, Al, Mo, Co, Ru, W, TiN, TaN, WN, etc.). The metal layer may then be patterned by a photolithographic process to form the interposer upper bonding pads 13*a*. The photolithographic process may include forming a patterned photoresist mask (not shown) on the metallic material, and etching (e.g., wet etching, dry etching, etc.) the exposed upper surface of the metallic material through openings in the photoresist mask. The photoresist mask may be subsequently removed by ashing, dissolving the photoresist mask or by consuming the photoresist mask during the etch process.

In at least one embodiment, the interposer upper bonding pads 13*a* may include an underbump metallurgy (UBM) layer stack deposited over the adhesive layer. The order of material layers within the UBM layer stack may be selected such that solder material portions may be subsequently bonded to portions of the bottom surface of the UBM layer stack. Layer stacks that may be used for the UBM layer stack include, but are not limited to, stacks of Cr/Cr—Cu/Cu/Au, Cr/Cr—Cu/Cu, TiW/Cr/Cu, Ti/Ni/Au, and Cr/Cu/Au. Other suitable materials are within the contemplated scope of disclosure. The thickness of the UBM layer stack may be in a range from 5 microns to 60 microns, such as from 10 microns to 30 microns, although lesser and greater thicknesses may also be used. A photoresist layer may be applied over the UBM layer stack and may be lithographically patterned to form an array of discrete patterned photoresist material portions. An etch process may be performed to remove unmasked portions of the UBM layer stack. The etch process may be an isotropic etch process or an anisotropic etch process. Remaining portions of the UBM layer stack may form the interposer upper bonding pads 13*a*. In at least one embodiment, the interposer upper bonding pads 13*a* may be arranged as a two-dimensional array, which may be a two-dimensional periodic array such as a rectangular periodic array.

The upper passivation layer 13 may then be formed on the chip-side surface of the interposer 10 and over the interposer upper bonding pads 13*a*. The upper passivation layer 13 may be formed by depositing (e.g., by CVD, PVD or other suitable deposition technique) one or more layers of passivation material including silicon oxide, silicon nitride, low-k dielectric materials such as carbon-doped oxides, extremely low-k dielectric materials such as porous carbon doped silicon dioxide, a combination thereof or other suitable material. The passivation material may then be planarized (e.g., by wet etching, drying etching, chemical mechanical polishing (CMP), etc.) so as to form the upper passivation layer 13.

FIG. 3B is a vertical cross-sectional view of an intermediate structure including the first semiconductor die 141, second semiconductor die 142 and third semiconductor die 143, according to one or more embodiments. The semiconductor dies 140 may be placed on the interposer 10, for example, by using an electro-mechanical pick-and-place (PNP) machine. Each of the semiconductor dies 140 may then be bonded to the interposer 10 by one or more microbumps 128. In at least one embodiment, the microbumps 128 may include a two-dimensional array of microbumps 128. Each of the semiconductor dies 140 may be attached to the interposer upper bonding pads 13*a* by a C2 bonding process, (e.g., solder bonding). In the C2 bonding process, an upper microbump portion (including a solder portion) may be positioned over a lower microbump portion formed on the interposer upper bonding pads 13*a* in the upper surface of the interposer 10. The intermediate structure may then be heated to cause reflow of the solder portion of the upper microbump portion.

Other methods of bonding the semiconductor dies 140 to the interposer 10 are within the contemplated scope of disclosure. In at least one embodiment, each of the semiconductor dies 140 may be bonded to the interposer 10 by a hybrid bond (i.e., a direct bond that may include a dielectric-to-dielectric bond, a polymer-to-polymer bond, and/or a metal-to-metal bond). In that embodiment, bonding pads withing the semiconductor dies 140 may be positioned on the interposer upper bonding pads 13*a*. In addition, an oxide layer and/or polymer layer of the semiconductor dies 140 may be positioned on the upper passivation layer 13. The intermediate structure may then be heated to bond the bonding pads of the semiconductor dies 140 to the interposer upper bonding pads 13*a* and bond the oxide layer and/or polymer layer of the semiconductor dies 140 to the upper passivation layer 13.

FIG. 3C is a vertical cross-sectional view of an intermediate structure including the interposer underfill layer 126 according to one or more embodiments. The interposer underfill layer 126 may be applied by depositing and/or injecting an epoxy-based polymeric material onto the interposer 10. The epoxy-based polymeric material may be applied on the interposer 10 so as to be formed under the semiconductor dies 140 and around the microbumps 128. In at least one embodiment, the epoxy-based polymeric material may fill substantially all of the gaps between the semiconductor dies 140 and the interposer 10. The interposer underfill layer 126 may then be cured, for example, in a box oven for duration in a range from 60 minutes to 120 minutes at a temperature in a range from 120° C. to 180° C. to provide the interposer underfill layer 126 with a sufficient stiffness and mechanical strength.

FIG. 3D is a vertical cross-sectional view of an intermediate structure including the molding material layer 127, according to one or more embodiments. The molding material layer 127 (e.g., encapsulant layer) may be formed by a sequence of an over-molding process and a planarization process. In particular, the molding material layer 127 may include an epoxy polymer material (e.g., an epoxy molding compound (EMC). The molding material layer 127 may be formed on the interposer 10 and fill in the gaps between the semiconductor dies 140. The molding material layer 127 may encapsulate (e.g., in the x-direction and y-direction) the semiconductor dies 140. The molding material layer 127 may be formed, for example, by a deposition process such as CVD, PECVD, PVD, spin coating, lamination or other suitable deposition technique.

The molding material layer 127 may be deposited so as to completely cover the semiconductor dies 140 and the interposer underfill layer 126. After the molding material layer 127 has cured, a planarization process may then be used to make an upper surface of the molding material layer 127 substantially coplanar with an upper surface of the semiconductor dies 140. The planarization process may be performed on the upper surface of the molding material layer 127 until an upper surface of the semiconductor dies 140 are exposed. The planarization process may include, for example, a mechanical grinding process and/or a CMP process.

FIG. 3E illustrates a vertical cross-sectional view of an intermediate structure including the plurality of C4 bumps 121, according to one or more embodiments. After the upper molding material layer 127 has been cured and planarized (e.g., by grinding, CMP, etc.), a second carrier substrate 2 may be attached to the intermediate structure of FIG. 3D. In particular, the second carrier substrate 2 may be attached to the upper surface of the molding material layer 127 and the upper surface of the semiconductor dies 140. The intermediate structure of FIG. 3D may then be inverted and the first carrier substrate 1 may be detached from the lower polymer layer 12 of the interposer 10. The first carrier substrate 1 may be detached from the interposer 10, for example, by deactivating the adhesive layer (not shown) adhering the first carrier substrate 1 to the interposer 10. The adhesive layer may be deactivated, for example, by a thermal anneal at an elevated temperature (e.g., for a thermally-deactivated adhesive material, or by exposing the adhesive layer to ultraviolet light (e.g., for an ultraviolet-deactivated adhesive material).

The interposer lower bonding pads 14*a* may then be formed on the lower polymer layer 12 of the interposer 10. The interposer lower bonding pads 14*a* may be formed using substantially the same materials and substantially the same photolithographic processes as described above for the interposer upper bonding pads 13*a*. The lower passivation layer 14 may then be formed on the lower polymer layer 12 of the interposer 10 and over the interposer lower bonding pads 14*a*. The lower passivation layer 14 may be formed using the same materials and processes described above for the upper passivation layer 13.

The lower passivation layer 14 may then be etched by a suitable etching process (e.g., by wet etching, dry etching, etc.) to form openings over the interposer lower bonding pads 14*a* and expose a surface of the interposer lower bonding pads 14*a*.

The plurality of C4 bumps 121 may then be formed on the intermediate structure. The C4 bumps 121 may include, for example, solder bumps formed in the openings in the lower passivation layer 14 over the interposer lower bonding pads 14*a*, for example, by an electroplating process. The plurality of C4 bumps 121 may contact the interposer lower bonding pads 14*a* through the openings in the lower passivation layer 14. In at least one embodiment, the C4 bumps 121 may be formed by forming one or more underbump metallization (UBM) layers (not shown) on the interposer lower bonding pads 14*a*, forming contact pads on the UBM layers, and forming the solder bumps on the contact pads.

Figure 4A:
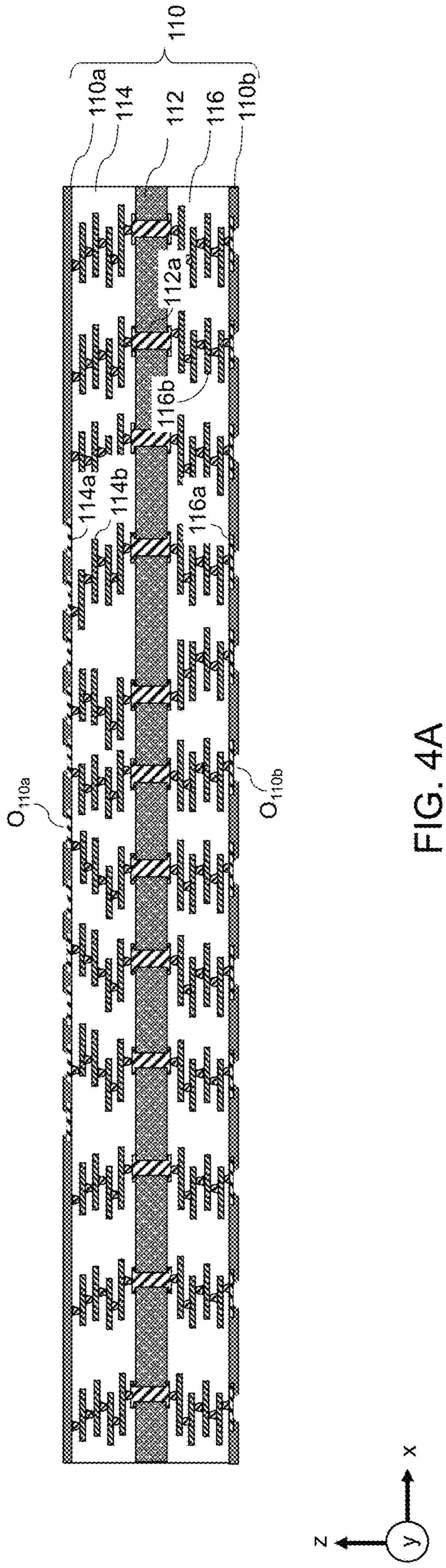
FIG. 4A is a vertical cross-sectional view of an intermediate structure including the package substrate having package substrate upper bonding pads and package substrate lower bonding pads, according to one or more embodiments.

FIG. 4A is a vertical cross-sectional view of an intermediate structure including the package substrate 110 having package substrate upper bonding pads 114*a* and package substrate lower bonding pads 116*a*, according to one or more embodiments. The package substrate 110 including the core 112, the package substrate upper dielectric layer 114, and the package substrate lower dielectric layer 116 may be provided.

The package substrate upper bonding pads 114*a* may be formed, for example, on an uppermost dielectric layer of the package substrate upper dielectric layer 114. The package substrate upper bonding pads 114*a* may be formed to contact the metal interconnect structures 114*b*. The package substrate upper bonding pads 114*a* may be formed by depositing a metal layer (e.g., copper, aluminum or other suitable conductive materials) on the upper surface of the package substrate upper dielectric layer 114. The metal layer may then be patterned by etching (e.g., by wet etching, dry etching, etc.) to form the package substrate upper bonding pads 114*a*. Other suitable metal layer materials and etching processes may be within the contemplated scope of disclosure.

The package substrate lower bonding pads 116*a* may be formed, for example, on a lowest dielectric layer of the package substrate lower dielectric layer 116. The package substrate lower bonding pads 116*a* may be formed to contact the metal interconnect structures 116*b*. The package substrate lower bonding pads 116*a* may be formed in a manner similar to the manner of forming the package substrate upper bonding pads 114*a* (e.g., depositing a metal layer, patterning the metal layer by etching, etc.).

After formation, the package substrate upper bonding pads 114*a* and package substrate lower bonding pads 116*a* may optionally undergo a surface roughening treatment (e.g., copper zarazara (CZ) treatment). In the surface roughening treatment, a surface of the package substrate upper bonding pads 114*a* (e.g., a copper surface) and surface of the package substrate lower bonding pads 116*a* (e.g., a copper surface) may be etched by an organic acid-type microetching solution, to create a super-roughened surface (e.g., copper surface). The uniquely-roughened copper surface topography of the package substrate upper bonding pads 114*a* and package substrate lower bonding pads 116*a* may help to achieve a high copper-to-resin adhesion.

The package substrate upper surface layer 110*a* and package substrate lower surface layer 110*b* may then be formed on the package substrate upper bonding pads 114*a* and package substrate lower bonding pads 116*a*, respectively. In at least one embodiment, the package substrate upper surface layer 110*a* may include a solder resist layer (e.g., polymer material), also referred to as a solder mask. The package substrate upper surface layer 110*a* may also be referred to as the upper solder resist layer 110*a*, and the package substrate lower surface layer 110*b* may also be referred to as the lower solder resist layer 110*b*.

The package substrate upper surface layer 110*a* and package substrate lower surface layer 110*b* may be applied concurrently. The package substrate upper surface layer 110*a* and package substrate lower surface layer 110*b* may be applied, for example, as a liquid photo-imageable film. The liquid photo-imageable film can be applied, for example, by silk-screening or spraying the liquid photo-imageable film onto the surface of the package substrate 110. The liquid photo-imageable film may be applied over the package substrate upper bonding pads 114*a* and the package substrate lower bonding pads 116*a*. The package substrate upper surface layer 110*a* and package substrate lower surface layer 110*b* may alternatively be applied as a dry-film photo-imageable film that may be vacuum-laminated onto the surface of the package substrate 110 and over the package substrate upper bonding pads 114*a* and package substrate lower bonding pads 116*a*, respectively. The package substrate upper surface layer 110*a* and package substrate lower surface layer 110*b* may alternatively or additionally be formed, for example, by chemical vapor deposition (CVD), physical vapor deposition (PVD), spin coating, lamination or other suitable deposition technique.

The package substrate upper surface layer 110*a* and package substrate lower surface layer 110*b* may be applied to have a thickness that is slightly greater than a thickness of the package substrate upper bonding pads 114*a* and package substrate lower bonding pads 116*a*, respectively. Alternatively, the package substrate upper surface layer 110*a* and package substrate lower surface layer 110*b* may be applied so as to have an upper surface that is substantially co-planar with an upper surface of the package substrate upper bonding pads 114*a* and package substrate lower bonding pads 116*a*, respectively.

Openings $O_{110a}$ may then be formed in the package substrate upper surface layer 110*a* so as to expose the upper surface of the package substrate upper bonding pads 114*a*. Openings $O_{110b}$ may be formed in the package substrate lower surface layer 110*b* to expose an upper surface of the package substrate lower bonding pads 116*a*. The openings $O_{110a}$ and the openings $O_{110b}$ may be formed, for example, by using a photolithographic process. In at least one embodiment, the openings $O_{110a}$ and the openings $O_{110b}$ may be formed in separate photolithographic processes.

The photolithographic process (e.g., processes) used to form the openings $O_{110a}$ may include forming a patterned photoresist mask (not shown) on the package substrate upper surface layer 110*a*, and etching (e.g., wet etching, dry etching, etc.) the exposed upper surface of the package substrate upper surface layer 110*a* through openings in the photoresist mask. The photoresist mask may be subsequently removed by ashing, dissolving the photoresist mask or by consuming the photoresist mask during the etch process.

The photolithographic process (e.g., processes) used to form the openings O110*b* may include forming a patterned photoresist mask (not shown) on the package substrate lower surface layer 110*b*, and etching (e.g., wet etching, dry etching, etc.) the exposed upper surface of the package substrate lower surface layer 110*b* through openings in the photoresist mask. The photoresist mask may be subsequently removed by ashing, dissolving the photoresist mask or by consuming the photoresist mask during the etch process.

After the openings $O_{110a}$ are formed in the package substrate upper surface layer 110*a* and the openings $O_{110b}$ are formed in the package substrate lower surface layer 110*b*, the package substrate upper surface layer 110*a* (upper solder resist layer) and the package substrate lower surface layer 110*b* may be cured such as by a thermal cure or ultraviolet (UV) cure.

Figure 4B:
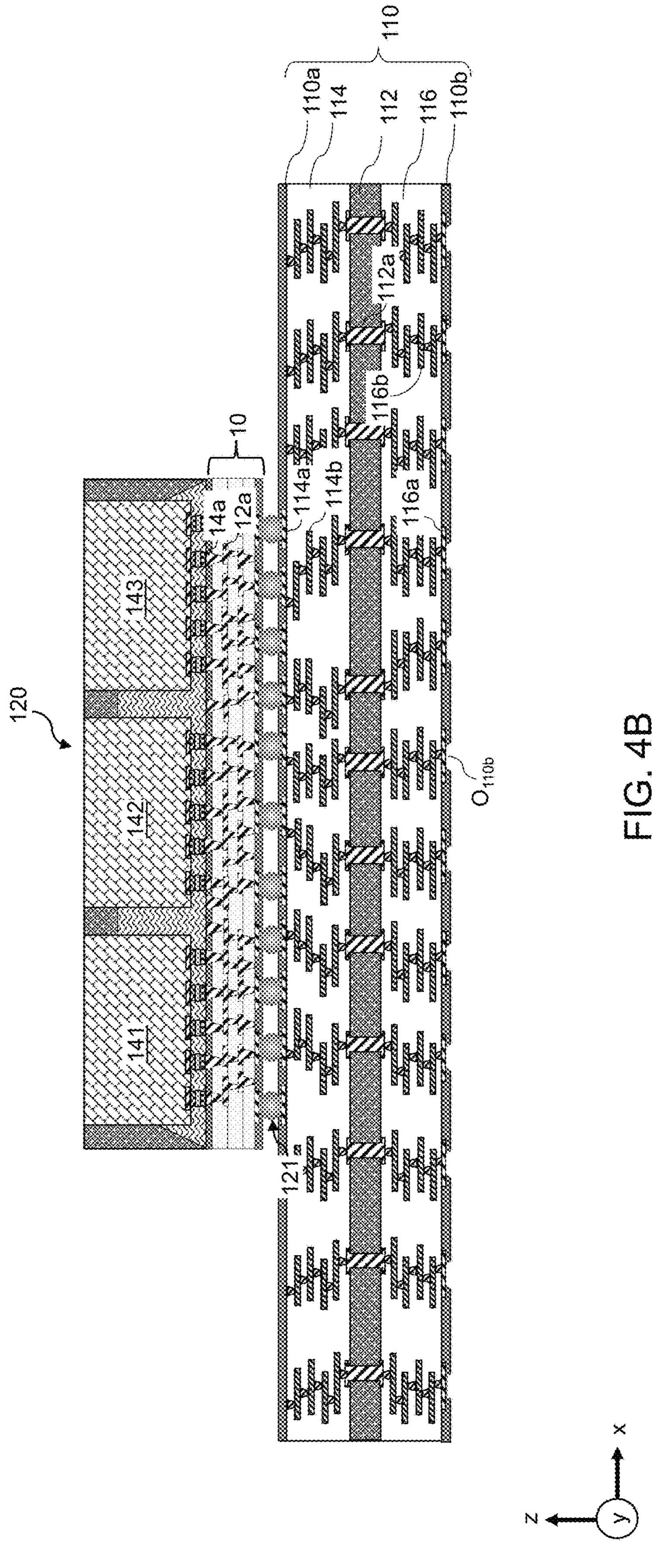
FIG. 4B illustrates a vertical cross-sectional view of an intermediate structure in which the semiconductor die module may be mounted on the package substrate, according to one or more embodiments.

FIG. 4B illustrates a vertical cross-sectional view of an intermediate structure in which the semiconductor die module 120 may be mounted on the package substrate 110, according to one or more embodiments. The semiconductor die module 120 may be mounted on the package substrate 110, for example, by a flip chip bonding (FCB) process. The semiconductor die module 121 may be positioned over the package substrate 110, for example, by an electromechanical pick-and-place (PNP) machine. The C4 bumps 121 on the semiconductor die module 121 may then be lowered onto the package substrate upper bonding pads 114*a* of the package substrate 110 and heated in order to collapse the C4 bumps 121 and bond the C4 bumps 121 to the package substrate upper bonding pads 114*a*.

Figure 4C:
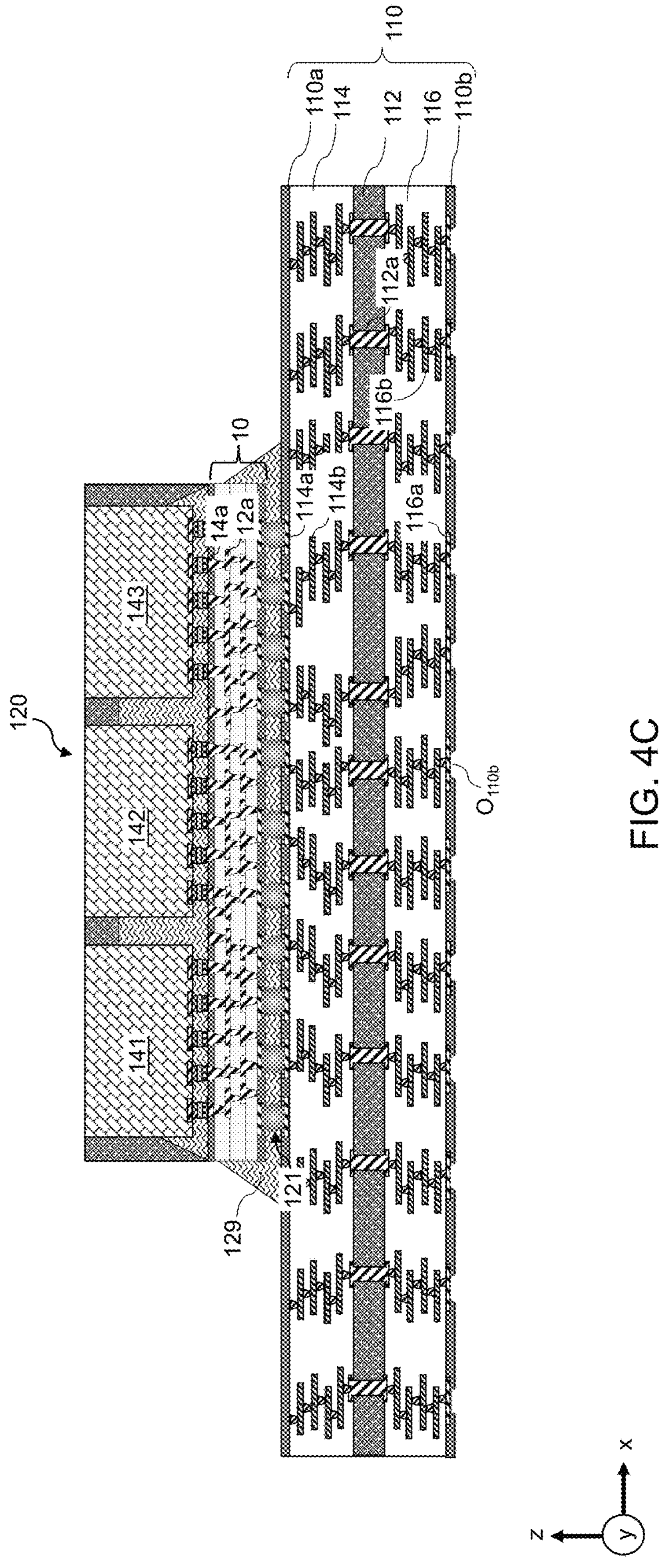
FIG. 4C illustrates a vertical cross-sectional view of an intermediate structure in which the package underfill layer may be formed on the package substrate according to one or more embodiments.

FIG. 4C illustrates a vertical cross-sectional view of an intermediate structure in which the package underfill layer 129 may be formed on the package substrate 110 according to one or more embodiments. The package underfill layer 129 may be formed of an epoxy-based polymeric material. As illustrated in FIG. 4C, the package underfill layer 129 may be formed (e.g., injected) under and around the semiconductor die module 120 and the C4 bumps 121 to the package substrate 110. The package underfill layer 129 may then be cured, for example, in a box oven for duration in a range from 60 minutes to 120 minutes at a temperature in a range from 120° C. to 180° C. to provide the interposer underfill layer 126 with a sufficient stiffness and mechanical strength.

Figure 4D:
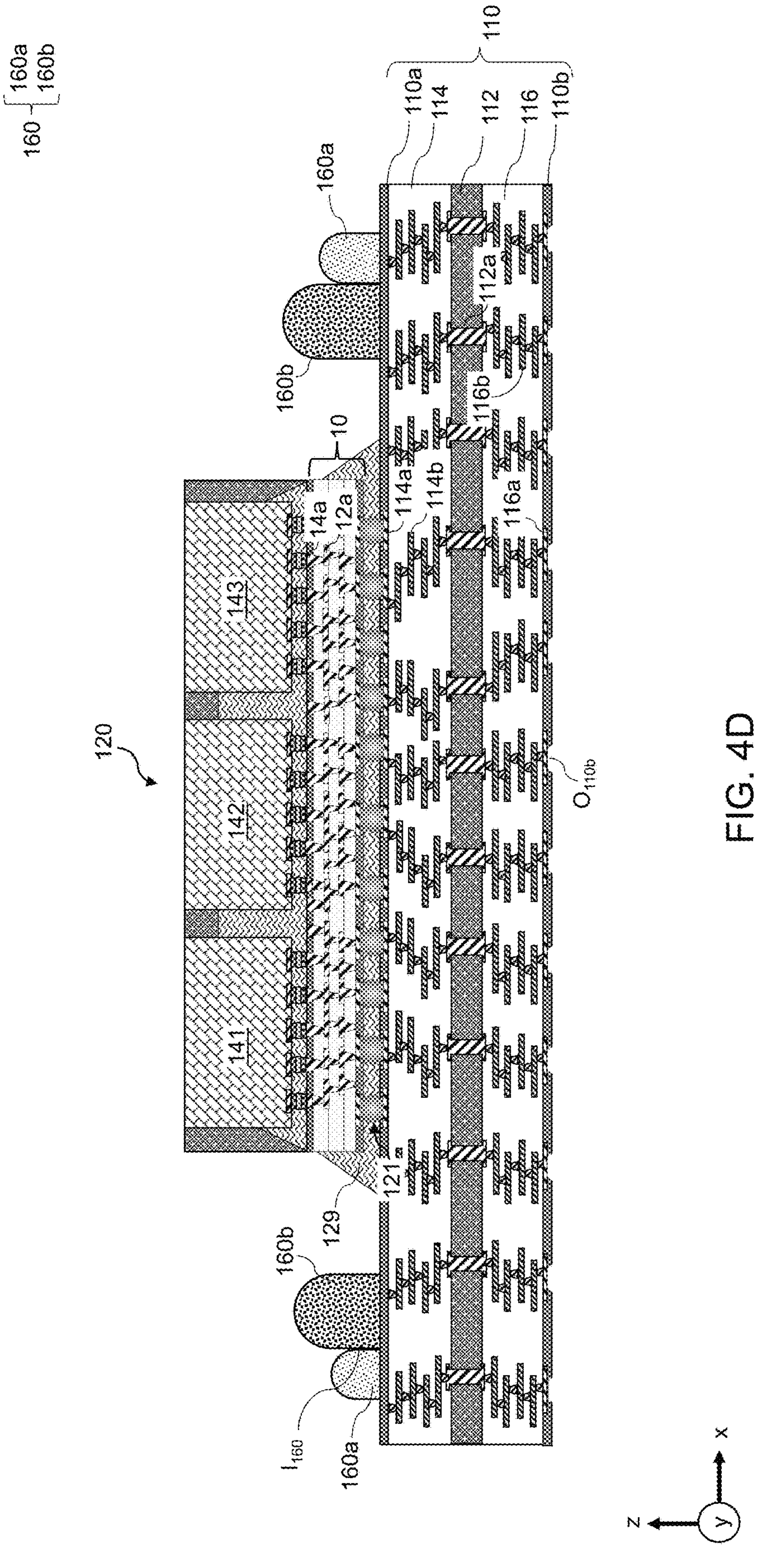
FIG. 4D illustrates a vertical cross-sectional view of an intermediate structure in which the adhesive may be applied to the package substrate according to one or more embodiments.

FIG. 4D illustrates a vertical cross-sectional view of an intermediate structure in which the adhesive 160 may be applied to the package substrate 110 according to one or more embodiments. The outer adhesive portion 160*a* and the inner adhesive portion 160*b* may be applied separately in two separate applications. For example, the inner adhesive portion 160*b* may be applied in a first step, and the outer adhesive portion 160*a* may be applied in a second step after the first step. In at least one embodiment, the order of application may be reversed. In the embodiment of separate application, separate dispensing tools may be used to dispense each of the outer adhesive portion 160*a* and the inner adhesive portion 160*b*. Alternatively, the outer adhesive portion 160*a* and the inner adhesive portion 160*b* may be applied concurrently in one step. In the embodiment of concurrent application, a combination dispensing tool having dual dispensing nozzles may be used. The combination dispensing tool may include a first nozzle for dispensing the outer adhesive portion 160*a* and a second nozzle adjacent the first nozzle for dispensing the inner adhesive portion 160*b*. The combination dispensing tool may dispense the outer adhesive portion 160*a* from the first nozzle at a first dispensing rate, and dispense the inner adhesive portion 160*b* from the second nozzle at a second dispensing rate greater than the first dispensing rate.

In the embodiment of both separate and concurrent applications, the dispensing tool may include an electromechanical dispensing tool. The electromechanical dispensing tool may be programmed to dispense a measured amount of adhesive for each of the outer adhesive portion 160*a* and the inner adhesive portion 160*b*.

The dispensing tool may dispense the adhesive for each of the outer adhesive portion 160*a* and the inner adhesive portion 160*b* in a frame shape around the semiconductor die module 120. The dispensing tool may dispense the outer adhesive portion 160*a* to have a first dispensing height and dispense the inner adhesive portion 160*b* to have a second dispensing height greater than the first dispensing height. In at least one embodiment, a difference in the first dispensing height of the inner adhesive portion 160*b* and the second dispensing height of the outer adhesive portion 160*a* may be substantially the same as step height of the bottom surface S130 of the ring structure 130 (i.e., a length of the sidewall $SW_{130a}$ of the outer ring structure portion 130*a*) (see FIG. 1C).

At the time of application, each of the outer adhesive portion 160*a* and the inner adhesive portion 160*b* may be sufficiently rigid so as to form a semi-solid bead on the surface of the package substrate 110. In at least one embodiment, a viscosity of each the outer adhesive portion 160*a* and the inner adhesive portion 160*b* at the time of application may be 50,000 centipoise (cp) or greater. The shape of the semi-solid bead may remain substantially unchanged between the time of application by the dispensing tool and the later time of attaching the ring structure 130.

The location of the frame shape of the dispensed adhesive 160 may correspond to a location of the ring structure 130 (e.g., see FIG. 1B). The dispensing tool may dispense the outer adhesive portion 160*a* and the inner adhesive portion 160*b* to contact each other and form the interface $I_{160}$ between the outer adhesive portion 160*a* and the inner adhesive portion 160*b*. The dispensing tool may dispense the outer adhesive portion 160*a* and the inner adhesive portion 160*b* to locate the interface $I_{160}$ at a location corresponding to an intended location of the inner sidewall $SW_{130a}$ of the outer ring structure portion 130*a* (see FIG. 1C). In at least one embodiment, a location of the interface $I_{160}$ at the time of dispensing the outer adhesive portion 160*a* and the inner adhesive portion 160*b* may be substantially the same as the location of the interface $I_{160}$ in the package structure 100.

In at least one embodiment, the dispensing tool may dispense the outer adhesive portion 160*a* and the inner adhesive portion 160*b* so that a gap (not shown) is formed between the outer adhesive portion 160*a* and the inner adhesive portion 160*b*. A width (in the x-direction) of the gap may be, for example, less than 0.5 mm. In embodiments in which the gap is formed, a center of the gap (in the x-direction) may be located at a intended location of the interface $I_{160}$ (i.e., at the intended location of the inner sidewall $SW_{130a}$ of the outer ring structure portion 130*a* (see FIG. 1C)). In this embodiment, the interface $I_{160}$ between the outer adhesive portion 160*a* and the inner adhesive portion 160*b* may be subsequently formed in the process of pressing the ring structure 130 onto the adhesive 160. That is, a pressing the ring structure 130 onto the adhesive 160 may deform the outer adhesive portion 160*a* so as to move into the gap and deform the inner adhesive portion 160*b* so as to move into the gap. The outer adhesive portion 160*a* may contact the inner adhesive portion 160*b* to close the gap and form the interface $I_{160}$.

Figure 4E:
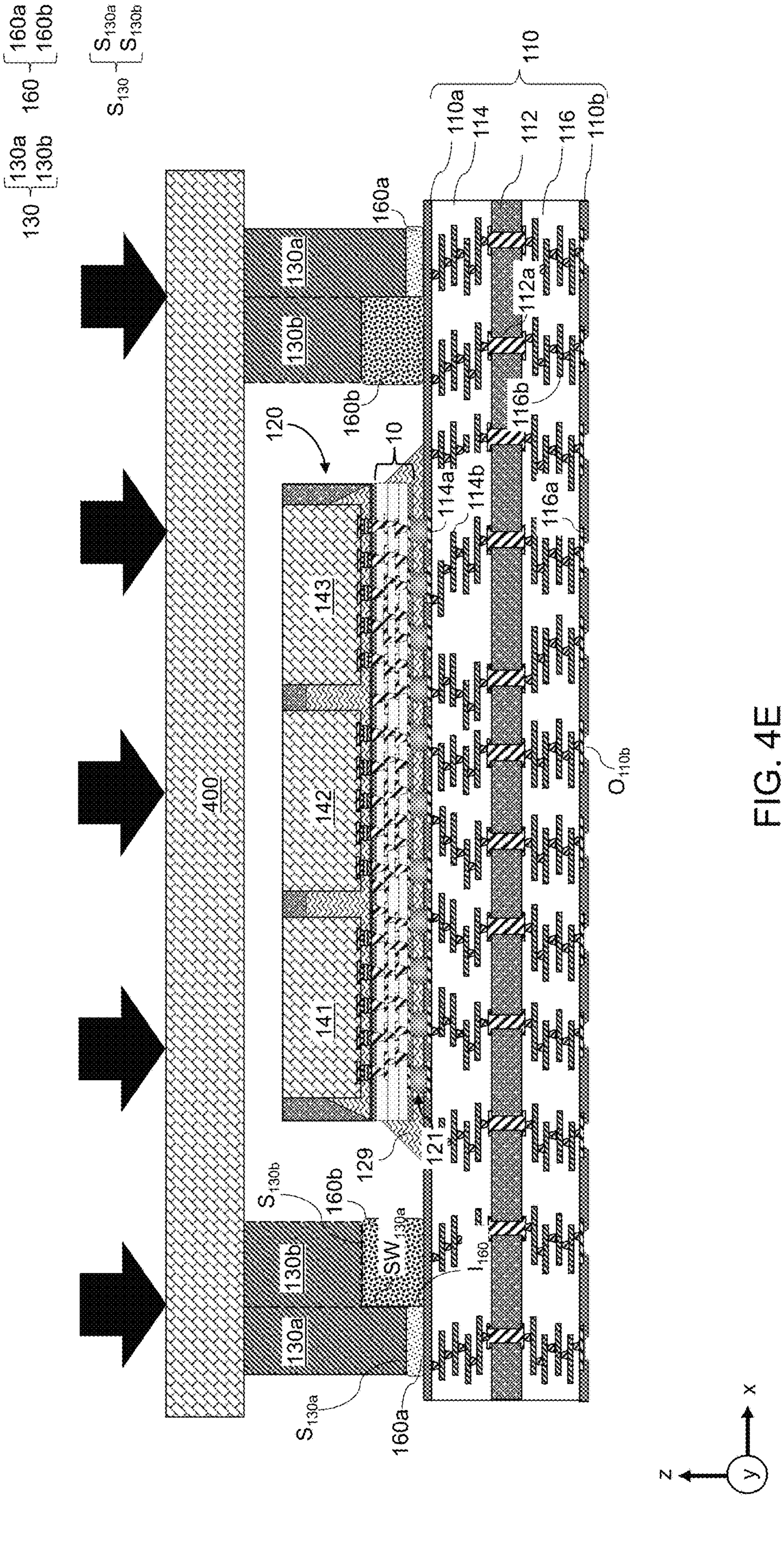
FIG. 4E illustrates a vertical cross-sectional view of an intermediate structure in which the ring structure may be attached to (e.g., mounted on) the package substrate according to one or more embodiments.

FIG. 4E illustrates a vertical cross-sectional view of an intermediate structure in which the ring structure 130 may be attached to (e.g., mounted on) the package substrate 110 according to one or more embodiments. After the ring structure 130 is formed (e.g., see FIGS. 2A-2D), the ring structure 130 may be attached to the package substrate 110 with the adhesive 160.

To attach the ring structure 130, the ring structure 130 may be moved into a position over the adhesive 160. The ring structure 130 may be moved into position, for example, using an electromechanical pick-and-place (PNP) machine. The ring structure 130 may be positioned over the adhesive 160 so that the sidewall $SW_{130a}$ is substantially aligned with the interface $I_{160}$ or in the embodiment where a gap is formed between the outer adhesive portion 160*a* and the inner adhesive portion 160*b*, with a center of the gap. The ring structure 130 may then be lowered onto the adhesive so that the bottom surface $S_{130a}$ of the outer ring structure portion 130*a* contacts an upper surface of the outer adhesive portion 160*a*, and the bottom surface $S_{130b}$ of the inner ring structure portion 130*b* contacts an upper surface of the inner adhesive portion 160*b*. In embodiments in which the difference in the height of the inner adhesive portion 160*b* and the height of the outer adhesive portion 160*a* is substantially the same as step height of the bottom surface $S_{130}$ of the ring structure 130, the bottom surface $S_{130a}$ of the outer ring structure portion 130*a* may contact an upper surface of the outer adhesive portion 160*a* and the bottom surface $S_{130b}$ of the inner ring structure portion 130*b* may contact an upper surface of the inner adhesive portion 160*b* at substantially the same time.

The ring structure 130 may then be pressed downwardly onto the adhesive 160 by a pressing force. The ring structure 130 may be pressed down on the adhesive 160 using the electromechanical pick-and-place (PNP) machine. The pressing force may be applied, for example, by a contact structure 400 that contacts the ring structure 130 around an entire periphery of the ring structure 130. In at least one embodiment, the contact structure 400 may have a size greater than a size of the ring structure 130. In at least one embodiment, and length (in the x-direction) and width (in the y-direction) of the contact structure 400 may be greater than the length and width of the ring structure 130, respectively. The pressing force applied by the contact structure 400 to the ring structure 130 may be substantially uniform over the entire periphery of the ring structure 130. In at least one embodiment, the intermediate structure may be heated as the ring structure 130 is pressed onto the adhesive 160. In at least one embodiment, the intermediate structure may be heated to a temperature in a range from 120° C. to 180° C. (e.g., at about 150° C.) as the ring structure 130 is pressed onto the adhesive 160.

In at least one embodiment, at the time of attaching the ring structure 130, a viscosity of the outer adhesive portion 160*a* may be substantially the same as a viscosity of the inner adhesive portion 160*b*. In at least one embodiment, a pressing force on the upper surface of the ring structure 130 may include a pressing force applied to the upper surface of the outer ring structure portion 130*a* and a pressing force applied to the upper surface of the inner ring structure portion 130*b*. In at least one embodiment, the pressing force applied to the upper surface of the outer ring structure portion 130*a* may be substantially the same as the pressing force applied to the upper surface of the inner ring structure portion 130*b*. In at least one embodiment, a viscosity of the outer adhesive portion 160*a* may be substantially the same as a viscosity of the inner adhesive portion 160*b*. In at least one embodiment, the pressing force of the ring structure 130 onto the adhesive 160 may cause the outer adhesive portion 160*a* to deform at a first deformation rate and cause the inner adhesive portion 160*b* to deform at a second deformation rate that is substantially the same as the first deformation rate.

The ring structure 130 may then be clamped to the package substrate 110 for a period to allow the outer adhesive portion 160*a* and the inner adhesive portion 160*b* to cure and form a secure bond between the package substrate 110 and the ring structure 130. The clamping of the ring structure 130 to the package substrate 110 may be performed, for example, by using a heat clamp module. The heat clamp module may apply a uniform force across the upper surface of the ring structure 130 in the x-direction and the y-direction. The heat clamp module may be applied as the adhesive 160 is cured at a temperature in a range from 120° C. to 180° C. (e.g., at about 150° C.).

Alternatively, the ring structure 130 may be placed on a surface (e.g., a flat surface), and the semiconductor die module 120 (which is mounted on the package substrate 110) may be inverted and inserted down into the ring structure 130. A downward force may then be applied to the package substrate lower surface layer 110*b* of the package substrate 110. The ring structure 130 may then be clamped to the package substrate 110 and the adhesive cured so as to bond the package substrate 110 to the ring structure 130.

Figure 4F:
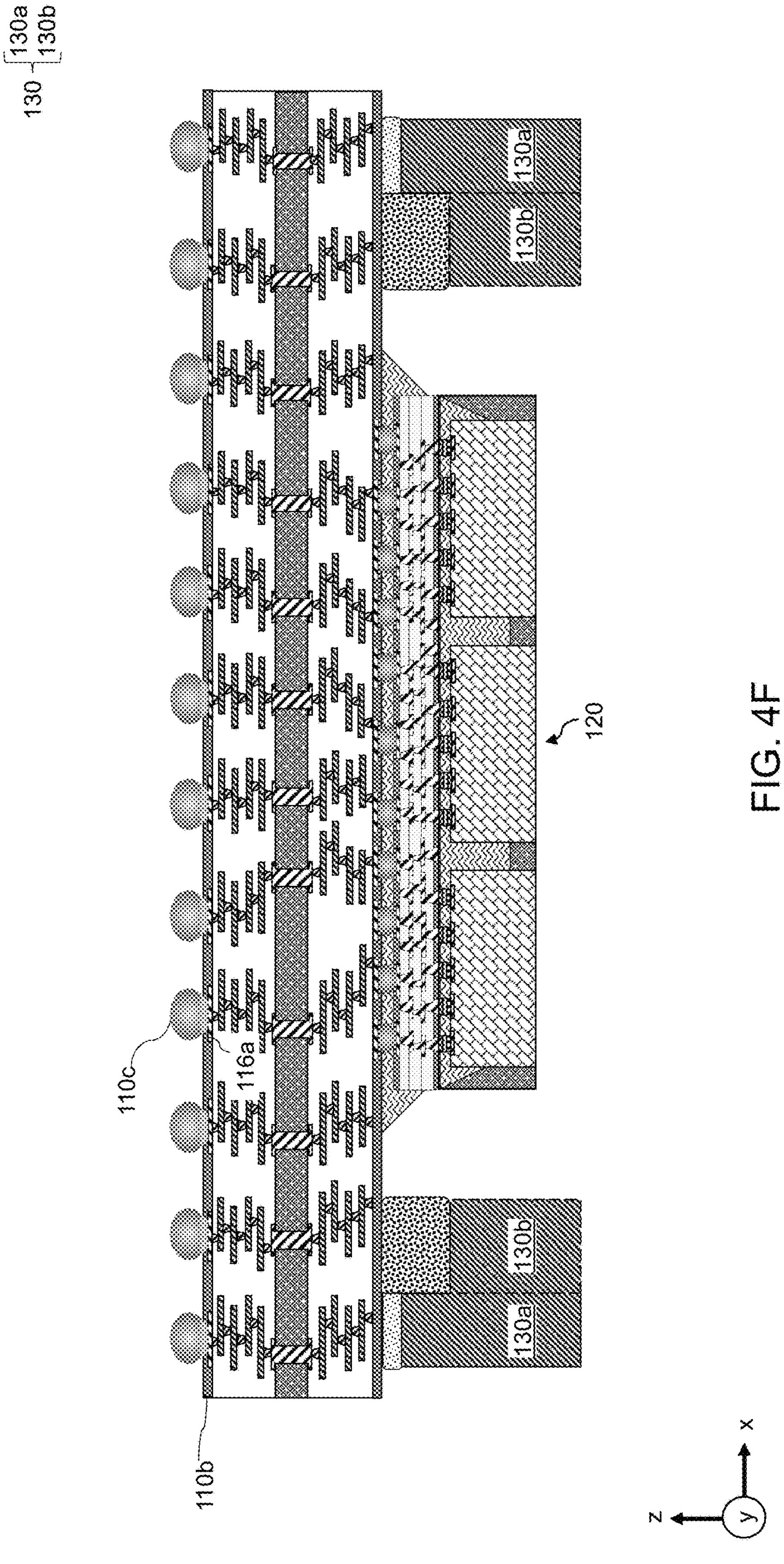
FIG. 4F illustrates a vertical cross-sectional view of an intermediate structure in which a plurality of solder balls may be formed on the package substrate according to one or more embodiments.

FIG. 4F illustrates a vertical cross-sectional view of an intermediate structure in which a plurality of solder balls 110*c* may be formed on the package substrate 110 according to one or more embodiments. The plurality of solder balls 110*c* may be formed on the lower bonding pads 116*a* through the openings O110*b* in the package substrate lower surface layer 110*b*. The solder balls 110*c* may be formed, for example, by an electroplating process. The solder balls 110*c* may be formed, for example, so as to be located under the ring structure 130 and under the interposer module 120. The plurality of solder balls 110*c* may constitute a ball-grid array (BGA) that may allow the package structure 100 to be securely mounted (e.g., by surface mount technology (SMT)) on a substrate such as a printed circuit board and electrically coupled to the substrate. Formation of the solder balls 110*c* may complete the formation of the package structure 100.

Figure 5:
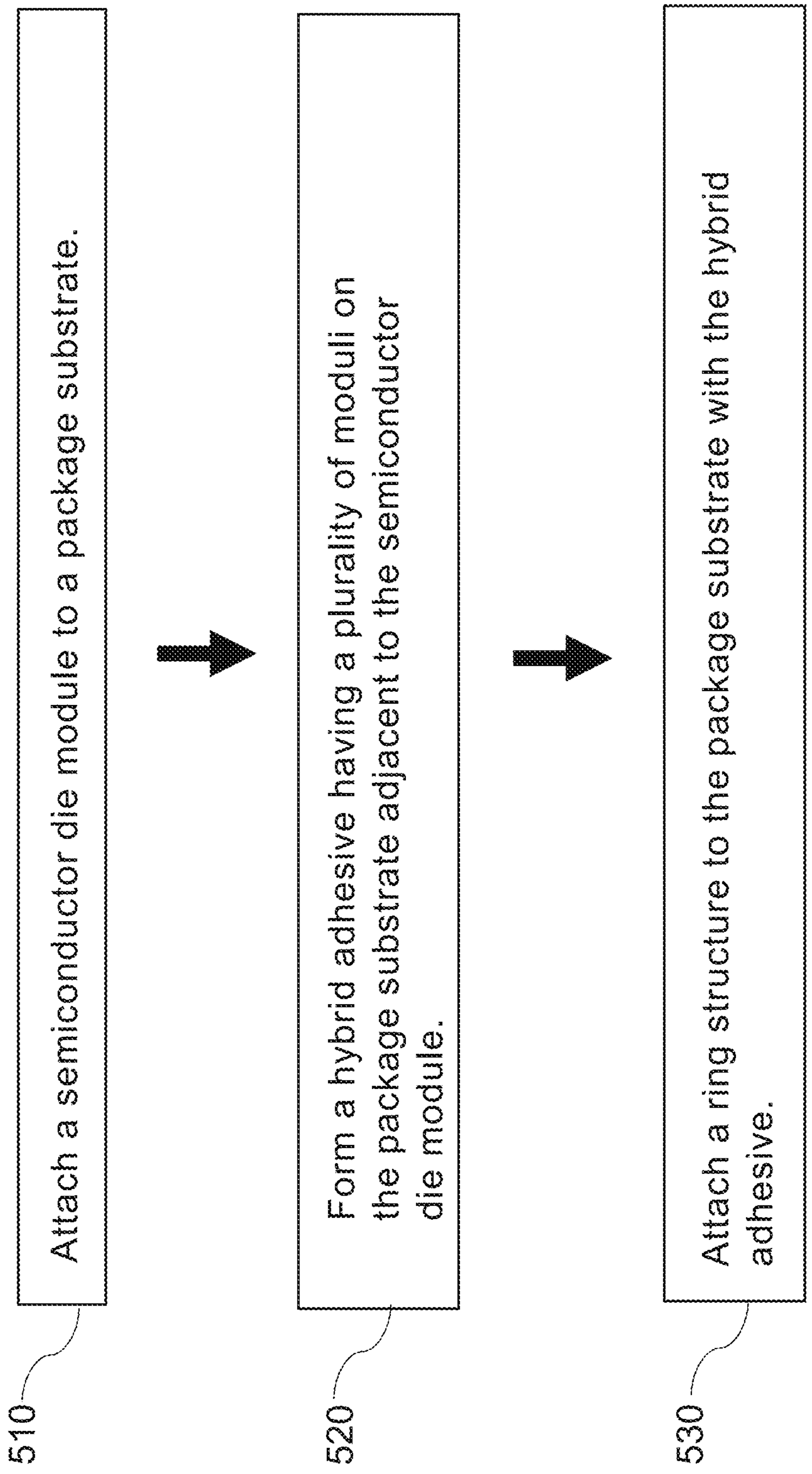
FIG. 5 is a flow chart illustrating a method of making the package structure according to one or more embodiments.

FIG. 5 is a flow chart illustrating a method of making the package structure 100 according to one or more embodiments. Step 510 includes attaching a semiconductor die module to a package substrate. Step 520 includes forming a hybrid adhesive having a plurality of moduli on the package substrate adjacent to the semiconductor die module. Step 530 includes attaching a ring structure to the package substrate with the hybrid adhesive.

Figure 6:
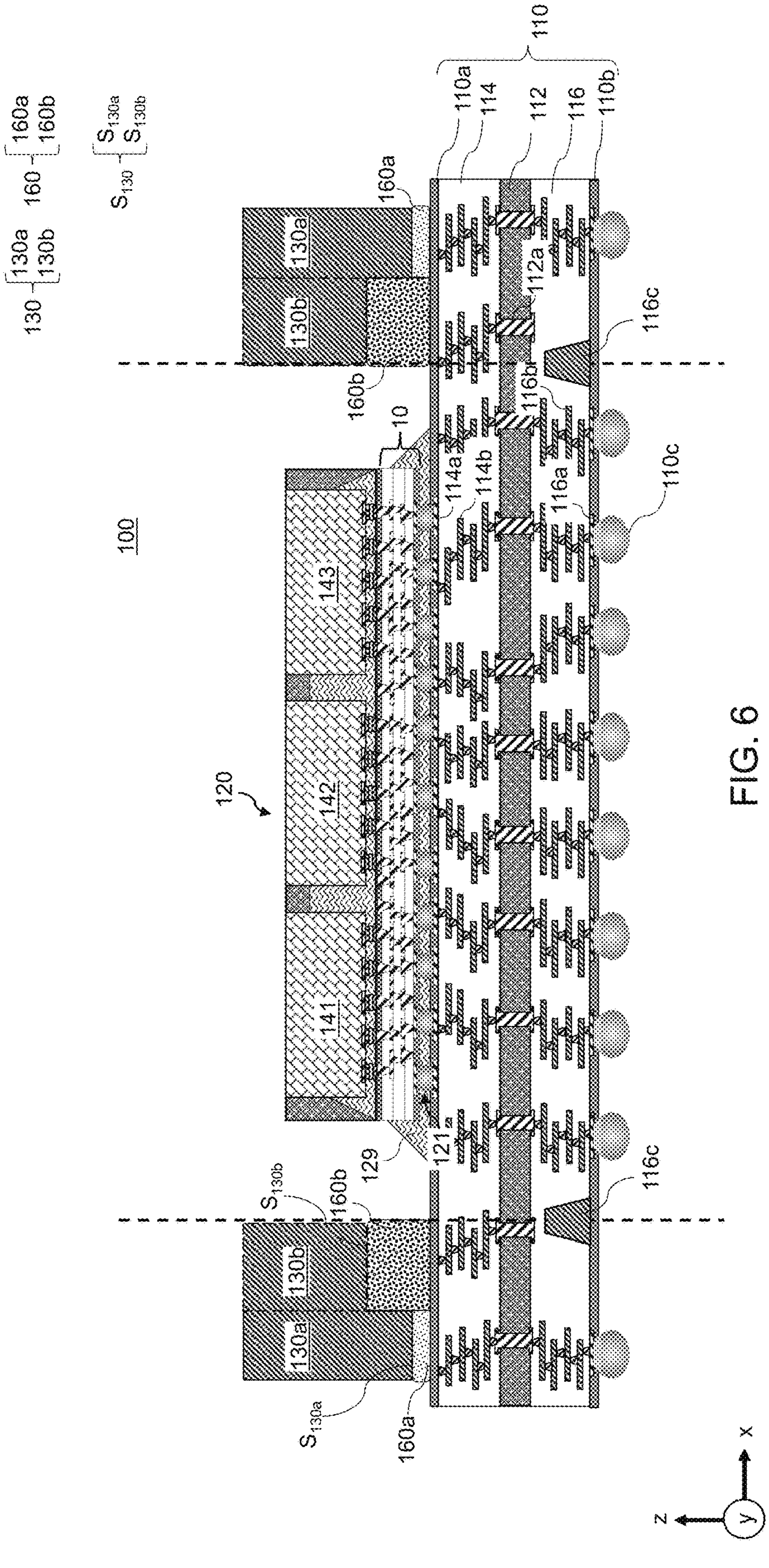
FIG. 6 is a vertical cross-sectional view of the package structure having a first alternative design according to one or more embodiments.

FIG. 6 is a vertical cross-sectional view of the package structure 100 having a first alternative design according to one or more embodiments. As illustrated in FIG. 6, in the first alternative design, the package structure may include an enhanced substrate design. In particular, the package substrate 110 may include one or more dummy vias 116*c* (e.g., dummy via array) that may mitigate development of a crack in the package substrate 110. The dummy vias 116*c* may be arranged, for example, in an array (e.g., having rows and columns). More particularly, the one or more dummy vias 116*c* may be located on the BGA side of the package substrate lower dielectric layer 116, and may enhance a strength of the package substrate 110, and thereby, inhibit (e.g., prevent) a crack issue (e.g., metal trace crack issue) in the package substrate 110. The one or more dummy vias 116*c* may be located close to an inner sidewall of the ring structure 130. In particular, a centerline of the one or more dummy vias 116c may be substantially aligned with the inner sidewall of the ring structure 130 and with the inner sidewall of the inner adhesive portion 160a. The first alternative design may, therefore, include the ring structure 130 to control package warpage and reduce a risk of underfill corner cracks and solder bump cracks, and the one or more dummy vias 116c to mitigate development of a crack in the package substrate 110.

Figure 7:
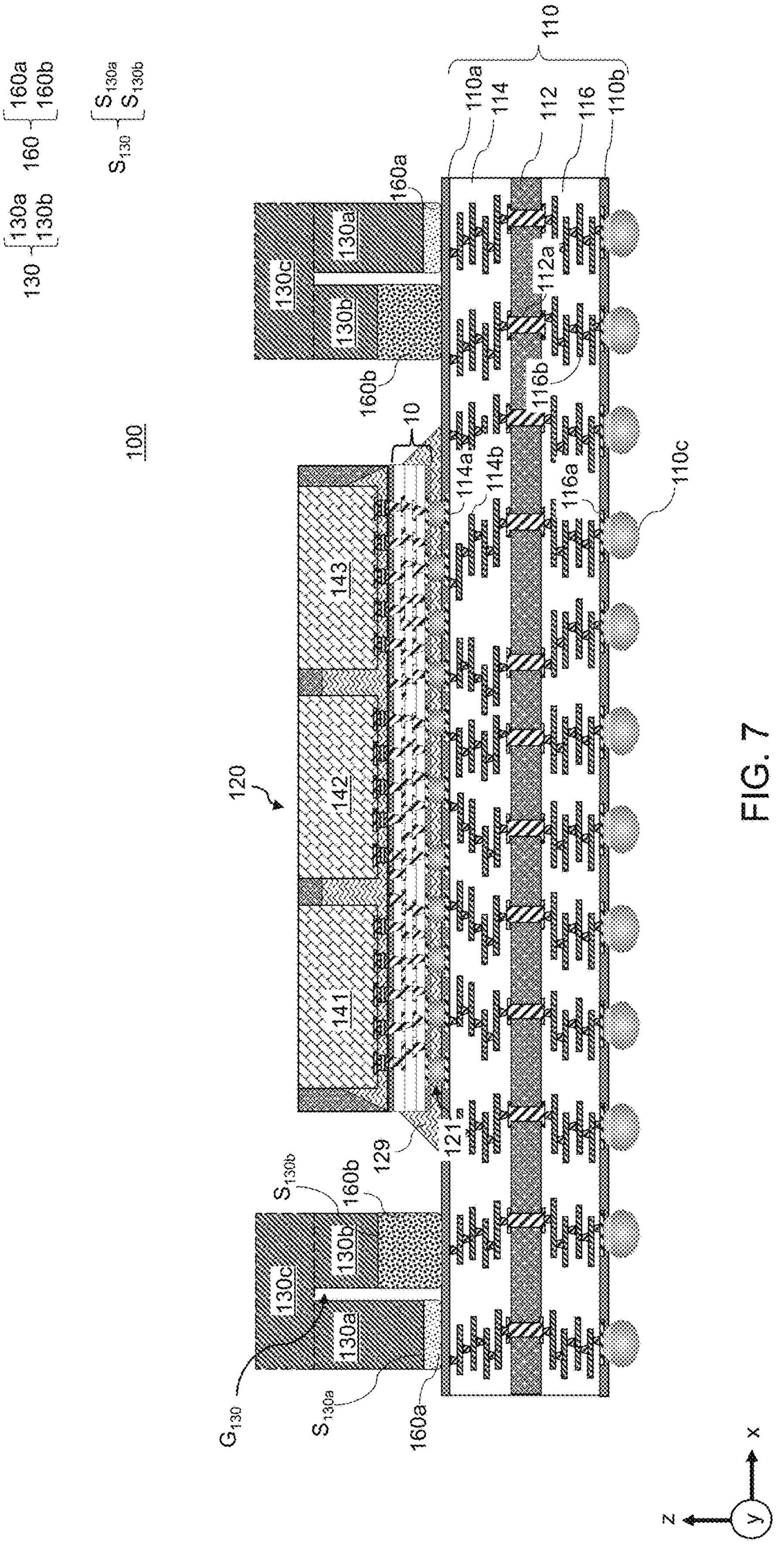
FIG. 7 is a vertical cross-sectional view of the package structure having a second alternative design according to one or more embodiments.

FIG. 7 is a vertical cross-sectional view of the package structure 100 having a second alternative design according to one or more embodiments. As illustrated in FIG. 7, in the second alternative design, the inner ring structure portion 130b may be separated (e.g., in the x-direction) from the outer ring structure portion 130a by a gap $G_{130}$. The ring structure 130 may also include a cap portion 130c connecting the outer ring structure portion 130a to the inner ring structure portion 130b. The cap portion 130c may extend laterally (e.g., in the x-direction) from an outer sidewall of the outer ring structure portion 130a to an inner sidewall of the inner ring structure portion 130b. The cap portion 130c may be integrally formed with the outer ring structure portion 130a and the inner ring structure portion 130b (e.g., formed as a single unit from a single sheet of metal). A thickness of the cap portion 130c may be in a range from 20% to 90% of the thickness $T_{130b}$ of the inner ring structure portion 130b.

The gap $G_{130}$ may have a width less than the inner distance Di (see FIG. 1C). In at least one embodiment, the gap $G_{130}$ may have a width less than 1 mm. The gap $G_{130}$ may be formed around an entire perimeter of the inner ring structure portion 130b. The width of the gap $G_{130}$ may be the same or may vary around the perimeter of the inner ring structure portion 130b. By including the gap $G_{130}$ between the outer ring structure portion 130a and the inner ring structure portion 130b, a risk of crack or delamination may be further mitigated.

Referring now to FIGS. 1A-7, a package structure 100 may include a package substrate 110, a semiconductor die module 120 on the package substrate 110, a ring structure 130 on the package substrate 110 adjacent to the semiconductor die module 120, and a hybrid adhesive 160 having a first modulus and a second modulus less than the first modulus, wherein the hybrid adhesive 160 adheres the ring structure 130 to the package substrate 110.

In one embodiment, the hybrid adhesive 160 may include an outer adhesive portion 160a having the first modulus, and an inner adhesive portion 160b having the second modulus less than the first modulus. In one embodiment, the first modulus of the outer adhesive portion 160a may be greater than 1 GPa at 25° C. and the second modulus of the inner adhesive portion 160b may be less than 200 MPa at 25° C. In one embodiment, the outer adhesive portion 160a may include a first thickness $T_{160a}$, and the inner adhesive portion 160b may include a second thickness $T_{160b}$ greater than the first thickness $T_{160a}$. In one embodiment, the second thickness $T_{160b}$ of the inner adhesive portion 160b may be greater than the first thickness $T_{160a}$ of the outer adhesive portion 160a by more than 10%. In one embodiment, the outer adhesive portion 160a may include a first width $W_{160a}$ and the inner adhesive portion 160b may include a second width $W_{160b}$ greater than the first width $W_{160a}$. In one embodiment, the second width $W_{160b}$ of the inner adhesive portion 160b may be greater than the first width $W_{160a}$ of the outer adhesive portion 160a by more than 10%. In one embodiment, the ring structure 130 may include an outer ring structure portion 130a attached to the package substrate 110 by the outer adhesive portion 160a, and an inner ring structure portion 130b attached to the package substrate 110 by the inner adhesive portion 160b. In one embodiment, the outer ring structure portion 130a may include a first thickness $T_{130a}$ and the inner ring structure portion 130b may include a second thickness $T_{130b}$ less than the first thickness $T_{130a}$, such that a bottom surface of the ring structure 130 further comprises a step shaped bottom surface. In one embodiment, the first thickness $T_{130a}$ of the outer ring structure portion 130a greater than the second thickness $T_{130b}$ of the inner ring structure portion 130b by more than 10%. In one embodiment, the outer adhesive portion 160a may include an epoxy-based adhesive, and the inner adhesive portion 160b may include a silicone-based adhesive. In one embodiment, the outer adhesive portion 160a may include a first amount of filler, and the inner adhesive portion 160b may include a second amount of filler less than the first amount of filler. In one embodiment, the outer adhesive portion 160a may include a first coefficient of thermal expansion (CTE), and the inner adhesive portion 160b may include a second CTE greater than the first CTE. In one embodiment, the first CTE of the outer adhesive portion 160a may be greater than 20 ppm/° C. below Tg and the second CTE of the inner adhesive portion 160b may be greater than 50 ppm/° C. over Tg.

Referring again to FIGS. 1A-7, a method of forming a package structure 100 may include attaching a semiconductor die module 120 to a package substrate 110, forming a hybrid adhesive 160 having a first modulus and a second modulus less than the first modulus on the package substrate 110 adjacent to the semiconductor die module 120, and attaching a ring structure 130 to the package substrate 110 with the hybrid adhesive 160.

In one embodiment, the forming of the hybrid adhesive 160 may include forming an outer adhesive portion 160a having the first modulus and forming an inner adhesive portion 160b having the second modulus less than the first modulus. In one embodiment, the forming of the outer adhesive portion 160a may include forming the outer adhesive portion 160a to have a first thickness $T_{160a}$ and the forming of the inner adhesive portion 160b may include forming the inner adhesive portion 160b to have a second thickness $T_{160b}$ greater than the first thickness $T_{160a}$. In one embodiment, the forming of the outer adhesive portion 160a may include forming the outer adhesive portion 160a to have a first width $W_{160a}$ and the forming of the inner adhesive portion 160b may include forming the inner adhesive portion 160b to have a second width $W_{160b}$ greater than the first width $W_{160a}$. In one embodiment, the method may further include forming the ring structure 130 to include an outer ring structure portion 130a having a first thickness $T_{130a}$ and an inner ring structure portion 130b having a second thickness $T_{130b}$ less than the first thickness $T_{130a}$, wherein the attaching of the ring structure 130 to the package substrate 110 may include attaching the outer ring structure portion 130a to the package substrate 110 with the outer adhesive portion 160a and attaching the inner ring structure portion 130b to the package substrate 110 with the inner adhesive portion 160b.

Referring again to FIGS. 1A-7, a package structure 100 may include a package substrate 110, a semiconductor die module 120 on the package substrate 110, wherein the semiconductor die module 120 may include an interposer and a plurality of semiconductor dies 140 on the interposer 10, a metal ring structure 130 having a step-shaped bottom surface $S_{130}$ on the package substrate 110 and surrounding the semiconductor die module 120, wherein the metal ring structure 130 includes an outer metal ring structure portion 130*a* having a first thickness $T_{130a}$, and an inner metal ring structure portion 130*b* having a second thickness $T_{130b}$ less than the first thickness $T_{130a}$, and a hybrid adhesive 160 attaching the metal ring structure 130 to the package substrate 110. The hybrid adhesive 160 may include an outer adhesive portion 160*a* having a first modulus, a first thickness $T_{160a}$ and a first width $W_{160a}$, and attaching the outer metal ring structure portion 130*a* to the package substrate 110, and an inner adhesive portion 160*b* having a second modulus less than the first modulus, a second thickness $T_{160b}$ greater than the first thickness $T_{160a}$, and a second width $W_{160b}$ greater than the first width $W_{160a}$, and attaching the inner metal ring structure portion 130*b* to the package substrate 110.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a package structure, the method comprising:

attaching a semiconductor die module to a package substrate;

forming a hybrid adhesive having a first modulus and a second modulus less than the first modulus on the package substrate adjacent to the semiconductor die module; and attaching a ring structure to the package substrate with the hybrid adhesive, wherein the ring structure comprises:

a step-shaped bottom surface; and an upper surface opposite the step-shaped bottom surface and terminating at an inner sidewall of the ring structure, wherein the ring structure comprises a plurality of discrete ring segments separated by a gap, and wherein attaching the ring structure to the package substrate deforms the hybrid adhesive into the gap.

2. The method of claim 1, wherein the forming of the hybrid adhesive comprises forming an outer adhesive portion having the first modulus and forming an inner adhesive portion having the second modulus less than the first modulus.

3. The method of claim 2, wherein the forming of the outer adhesive portion comprises forming the outer adhesive portion to have a first thickness and the forming of the inner adhesive portion comprises forming the inner adhesive portion to have a second thickness greater than the first thickness.

4. The method of claim 2, wherein the forming of the outer adhesive portion comprises forming the outer adhesive portion to have a first width and the forming of the inner adhesive portion comprises forming the inner adhesive portion to have a second width greater than the first width.

5. The method of claim 2, further comprising:

forming the ring structure to include an outer ring structure portion having a first thickness and an inner ring structure portion having a second thickness less than the first thickness, wherein the attaching of the ring structure to the package substrate comprises:

aligning an inner sidewall of the outer ring structure portion with an interface between the outer adhesive portion and the inner adhesive portion; and after the aligning of the inner sidewall, attaching the outer ring structure portion to the package substrate with the outer adhesive portion and attaching the inner ring structure portion to the package substrate with the inner adhesive portion.

6. The method of claim 5, wherein the inner sidewall of the ring structure comprises an inner sidewall of the inner ring structure portion, attaching of the inner ring structure portion is performed such that the inner sidewall of the inner ring structure portion is separated from the semiconductor die module by a first distance, and the attaching of the outer ring structure portion is performed such that an outer sidewall of the outer ring structure portion is separated from an edge of the package substrate by a second distance less than the first distance.

7. The method of claim 2, wherein the attaching of the ring structure comprises:

pressing the ring structure onto the inner adhesive portion and the outer adhesive portion; and curing the inner adhesive portion and the outer adhesive portion under pressure to attach the ring structure to the package substrate.

8. The method of claim 7, wherein the pressing of the ring structure onto the inner adhesive portion and the outer adhesive portion comprises clamping the ring structure onto the package substrate with a heat clamp module, and the curing of the inner adhesive portion and the outer adhesive portion comprises curing the inner adhesive portion and the outer adhesive portion while the ring structure is clamped onto to the package substrate with the heat clamp module.

9. The method of claim 7, wherein the pressing of the ring structure onto the inner adhesive portion and the outer adhesive portion comprises pressing the ring structure onto the inner adhesive portion and the outer adhesive portion such that a width of the inner adhesive portion is greater than a width of the outer adhesive portion by more than 10%.

10. The method of claim 7, wherein the pressing of the ring structure onto the inner adhesive portion and the outer adhesive portion comprises pressing the ring structure onto the inner adhesive portion and the outer adhesive portion such that a thickness of the inner adhesive portion is greater than a thickness of the outer adhesive portion by more than 10%.

11. The method of claim 7, wherein the pressing of the ring structure onto the inner adhesive portion and the outer adhesive portion comprises pressing the ring structure onto the inner adhesive portion and the outer adhesive portion such that a height of an upper surface of the ring structure is greater than a height of an upper surface of the semiconductor die module.

12. A method of forming a package structure, the method comprising:

attaching a die module to a package substrate;

forming an outer adhesive having a first modulus on the package substrate adjacent the die module;

forming an inner adhesive on the package substrate between the outer adhesive and the die module such that an interface between the inner adhesive and the outer adhesive is formed, wherein the inner adhesive has a second modulus less the first modulus;

positioning a stiffener over the outer adhesive and the inner adhesive, wherein the stiffener comprises:

an outer ring portion and an inner ring portion;

a step-shaped bottom surface; and an upper surface opposite the step-shaped bottom surface and terminating at an inner sidewall of the stiffener, wherein a sidewall of at least one of the outer ring portion or inner ring portion is aligned with the interface between the inner adhesive and the outer adhesive; and pressing the step-shaped bottom surface of the stiffener onto the outer adhesive and the inner adhesive to attach the stiffener to the package substrate with the outer adhesive and the inner adhesive.

13. The method of claim 12, wherein the forming of the inner adhesive comprises forming the inner adhesive to have a thickness greater than a thickness of the outer adhesive.

14. The method of claim 12, wherein the forming of the inner adhesive comprises forming the inner adhesive to have a width greater than a width of the outer adhesive.

15. The method of claim 12, wherein the stiffener has an outer bottom surface and an inner bottom surface having a height greater than a height of the outer bottom surface, and the pressing of the stiffener onto the outer adhesive and the inner adhesive comprises pressing the outer bottom surface onto the outer adhesive and pressing the inner bottom surface onto the inner adhesive.

16. The method of claim 12, wherein the attaching of the die module to the package substrate comprises:

positioning the die module over the package substrate;

lowering the die module onto the package substrate and connecting the die module to the package substrate with a plurality of solder bumps; and forming a package underfill layer on the package substrate under the die module and around the solder bumps.

17. A method of forming a package structure, the method comprising:

dispensing a first adhesive to a first height having a first rigidity onto a package substrate;

dispensing a second adhesive onto the package substrate adjacent the first adhesive to a second height that is different than the first height, wherein the second adhesive has a second rigidity different than the first rigidity;

positioning a stiffener over the first adhesive and the second adhesive, wherein the stiffener comprises:

a step-shaped bottom surface; and an upper surface opposite the step-shaped bottom surface and terminating at an inner sidewall of the stiffener; and pressing the stiffener onto the first adhesive and the second adhesive to attach the stiffener to the package substrate with the first adhesive and the second adhesive.

18. The method of claim 17, further comprising:

attaching a die module to the package substrate before the forming of the first adhesive, wherein the forming of the second adhesive comprises forming the second adhesive on the package substrate between the die module and the first adhesive.

19. The method of claim 17, wherein the second adhesive has a coefficient of thermal expansion greater than 50 ppm/° C. over Tg and the forming of the second adhesive comprises forming the second adhesive to be in contact with the first adhesive.

20. The method of claim 17, wherein the stiffener has a first bottom surface and a second bottom surface having a height greater than a height of the first bottom surface, and the pressing of the stiffener onto the first adhesive and the second adhesive comprises pressing the first bottom surface onto the first adhesive and pressing the second bottom surface onto the second adhesive.

* * * * *